United States Patent
Yoshino

(10) Patent No.: US 9,064,714 B2
(45) Date of Patent: Jun. 23, 2015

(54) SEMICONDUCTOR DEVICE AND METHOD FOR MANUFACTURING THE SAME

(71) Applicant: MITSUBISHI ELECTRIC CORPORATION, Tokyo (JP)

(72) Inventor: Manabu Yoshino, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/479,552

(22) Filed: Sep. 8, 2014

(65) Prior Publication Data

US 2015/0137306 A1    May 21, 2015

(30) Foreign Application Priority Data

Nov. 21, 2013  (JP) ................................ 2013-241061

(51) Int. Cl.
| | |
|---|---|
| *H01L 29/78* | (2006.01) |
| *H01L 29/06* | (2006.01) |
| *H01L 21/265* | (2006.01) |
| *H01L 21/266* | (2006.01) |
| *H01L 21/306* | (2006.01) |
| *H01L 21/308* | (2006.01) |

(52) U.S. Cl.
CPC ............ *H01L 29/063* (2013.01); *H01L 21/265* (2013.01); *H01L 21/266* (2013.01); *H01L 21/30604* (2013.01); *H01L 21/308* (2013.01)

(58) Field of Classification Search
CPC ............ H01L 2924/00; H01L 29/7801; H01L 29/0696; H01L 29/7816; H01L 21/761; H01L 27/088; H01L 29/402; H01L 29/808; H01L 29/063; H01L 29/0878; H01L 21/74; H01L 29/0619

See application file for complete search history.

(56) References Cited

U.S. PATENT DOCUMENTS

| | | | |
|---|---|---|---|
| 4,292,642 A | 9/1981 | Appels et al. | |
| 2014/0346633 A1* | 11/2014 | Jonishi et al. | 257/493 |

OTHER PUBLICATIONS

Appels, J.A. et al.; "High voltage thin layer devices (RESURF devices)"; IEDM pp. 238-241, 1979.
Appels, J.A. et al.; "Thin layer high-voltage devices (RESURF devices)"; Philips Journal of Research 35 pp. 1-13, 1980.

* cited by examiner

*Primary Examiner* — Roy Potter
*Assistant Examiner* — Paul Patton
(74) *Attorney, Agent, or Firm* — Studebaker & Brackett PC

(57) ABSTRACT

An N type diffusion layer in which a high-side circuit region is disposed is formed from a surface of a P type epitaxial layer covering a surface of a P type semiconductor substrate to reach the surface of the semiconductor substrate. An N type high breakdown voltage isolation region is formed with a prescribed width to surround high-side circuit region. High breakdown voltage isolation region includes a corner portion located along a corner pattern of rectangular high-side circuit region, and a linear portion located along a linear pattern thereof. The concentration of an impurity in an N type diffusion layer of corner portion is set to be higher than the concentration of an impurity in an N type diffusion layer of linear portion.

12 Claims, 22 Drawing Sheets

| IMPLANT IMPURITIES INTO HIGH BREAKDOWN VOLTAGE ISOLATION REGION IN DISTRIBUTED MANNER | | S2 |
|---|---|---|
| LINEAR PORTION | CORNER PORTION | |
| IMPLANT N TYPE IMPURITY ↓↓↓↓↓↓↓ | IMPLANT N TYPE IMPURITY ↓↓↓↓↓↓↓ | |
| IMPLANT P TYPE IMPURITY (REDUCE N TYPE IMPURITY CONCENTRATION) ↓↓↓↓↓↓↓ | IMPLANTATION MASK | |

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the semiconductor device, and particularly to a semiconductor device with a lateral high breakdown voltage element and a method for manufacturing such a semiconductor device.

2. Description of the Background Art

As a semiconductor device with a lateral high breakdown voltage element, a driver circuit for operating a load such as an induction motor or the like will be described. A drive control circuit includes a low-side circuit that controls switching operation of a semiconductor device such as an IGBT (Insulated Gate Bipolar Transistor) or the like, using a substrate potential as a reference, a high-side circuit that controls switching operation of the semiconductor device using a prescribed potential (high voltage) higher than the substrate potential as a reference, and a level shift circuit that transmits a signal between the high-side circuit and the low-side circuit.

The high-side circuit is electrically isolated from the low-side circuit. Structurally, by way of a high breakdown voltage isolation region formed to surround a periphery of a high-side circuit region where the high-side circuit is formed, the high-side circuit region and a low-side circuit region where the low-side circuit is formed are electrically isolated from each other.

The high breakdown voltage isolation region electrically isolates the substrate potential and the high voltage by utilizing a resurf structure (effect). That is, in the high breakdown voltage isolation region, the impurity concentration of an N type impurity region (CN) and the thickness (d) of the impurity region are so set to satisfy a resurf condition (CN× d≤prescribed concentration). Non-patent document 1 (J. A. Appels and H. M. J Vaes "High voltage thin layer devices (RESURF devices)" IEDM, pp 238-241 1979.) and non-patent document 2 (J. A. Appels, M. G. Collet, P. A. H. Hart, H. M. J. Vaes and J. F. C. M. Verhoeven "Thin layer high-voltage devices (RESURF devices)" Philips J. Res. 35, 1-13, 1980.) can be mentioned as examples of documents that disclose resurf structures.

When, for example, a rectangular pattern is employed as the layout pattern of the high-side circuit region, the high breakdown voltage isolation region extends linearly (linear portion) in a section of the pattern extending linearly, and has a fan shape at corners of the pattern (corner portion). The high breakdown voltage isolation region is thus constituted of the linear portion and the corner portion.

Conventionally, in the high breakdown voltage isolation region, the impurity concentration in the linear portion and the impurity concentration in the corner portion are set to be the same.

SUMMARY OF THE INVENTION

The N type impurity region of the high breakdown voltage isolation region is in contact with a P type impurity region of the low-side circuit region. Breakdown voltages of the high-side circuit region and the low-side circuit region are determined by an extension of a depletion layer when a reverse voltage is applied to a PN junction where the N type impurity region and the P type impurity region contact each other.

In the linear portion and the corner portion of the high breakdown voltage isolation region, the volume of the corner portion (VC) is smaller than the volume of the linear portion (VL), based on the PN junction area of the same area. Hence, where the impurity concentration in the N type impurity region (CN) and the impurity concentration in the P type impurity region (CP) are the same, the number of impurity atoms in the corner portion (CN×VC) is smaller than the number of impurity atoms in the linear portion (CP×VL).

The extension of the depletion layer is thus different between the linear portion and the corner portion, so that the same breakdown voltage (maximum breakdown voltage) cannot be obtained in both the linear portion and the corner portion. Consequently, the breakdown voltage of the semiconductor device is determined by the lower one of the breakdown voltages of the linear portion and the corner portion.

The present invention was made in view of the above-described problems. One object is to provide a semiconductor device in which a decrease in breakdown voltage is prevented. Another object is to provide a method for manufacturing such a semiconductor device.

A semiconductor device according to the present invention includes a semiconductor substrate having a main surface, a first semiconductor layer of a first conductivity type, a second semiconductor layer of a second conductivity type, a first region, a second region, and an isolation region of a second conductivity type. The first semiconductor layer of the first conductivity type is formed to cover the main surface of the semiconductor substrate. The second semiconductor layer of the second conductivity type is formed to reach a first depth from a surface of the first semiconductor layer. The first region is disposed in the first semiconductor layer, and a first circuit driven with a first voltage is formed in the first region. The second region is disposed in the second semiconductor layer, and a second circuit driven with a second voltage higher than the first voltage is formed in the second region. The isolation region of the second conductivity type is formed with a width in the second semiconductor layer along the second region to surround the second region, and electrically isolates the first region and the second region. The second region includes a linear pattern and a corner pattern as a layout pattern. The isolation region includes a third semiconductor layer and a fourth semiconductor layer. The third semiconductor layer has a first impurity of the second conductivity type, and is located, with the width and a first thickness, along the linear pattern, and joins to the first semiconductor layer. The fourth semiconductor layer has a second impurity of the second conductivity type, and is located, with the width and a second thickness, along the corner pattern, and joins to the first semiconductor layer. The area of a junction surface where the fourth semiconductor layer and the first semiconductor layer join to each other is referred to as an area A. In the third semiconductor layer, a region having the width and the first thickness, in which the area of a junction surface where the third semiconductor layer and the first semiconductor layer join to each other corresponds to the same area as the area A, is referred to as a region A. A concentration of the first impurity and the first thickness of the third semiconductor layer, and a concentration of the second impurity and the second thickness of the fourth semiconductor layer are set in such a manner that the number of atoms of the second impurity in the fourth semiconductor layer, and the number of atoms of the first impurity in the region A of the third semiconductor layer become the same.

A method for manufacturing a semiconductor device according to the present invention includes the following steps. A semiconductor substrate having a main surface is prepared. A first semiconductor layer of a first conductivity type in which a first region is disposed to cover the main surface of the semiconductor substrate is formed. A second semiconductor layer of a second conductivity type in which a second region is disposed is formed to reach a first depth from a surface of the first semiconductor layer. In the second semiconductor layer, an isolation region is formed with a width to reach the first depth along the second region to surround the second region. In the first region, a first circuit driven with a first voltage is formed. In the second region, a second circuit driven with a second voltage higher than the first voltage is formed. In the second region, a layout pattern including a linear pattern and a corner pattern is formed as a layout pattern. The step of forming the isolation region includes the step of forming the third semiconductor layer that has the width and reaches the first depth, by introducing a first impurity of the second conductivity type along the linear pattern, and the step of forming the fourth semiconductor layer that has the width and reaches the first depth, by introducing a second impurity of the second conductivity type along the corner pattern. The area of a junction surface where the fourth semiconductor layer and the first semiconductor layer join to each other is referred to as area A. In the third semiconductor layer, a region that has a width and reaches the first depth, in which the area of a junction surface where the third semiconductor layer and the first semiconductor layer join to each other corresponds to the same area as the area A, is referred to as region A. In the step of forming the third semiconductor layer and the fourth semiconductor layer, the first impurity to be introduced into a region where the third semiconductor layer is to be formed, and the second impurity to be introduced into the fourth semiconductor layer are adjusted in such a manner that the number of atoms of the second impurity to be introduced into the fourth semiconductor layer, and the number of atoms of the first impurity to be introduced into the region A become the same.

In the semiconductor device according to the present invention, when each of the first voltage and the second voltage is applied, in the isolation region, the width of a depletion layer that extends in the third semiconductor layer is the same as the width of the depletion layer that extends in the fourth semiconductor layer. Consequently, a decrease in breakdown voltage can be prevented.

In the method for manufacturing a semiconductor device according to the present invention, when each of the first voltage and the second voltage is applied, in the isolation region, the width of the depletion layer that extends in the third semiconductor layer is the same as the width of the depletion layer that extends in the fourth semiconductor layer. Consequently, a semiconductor device in which a decrease in breakdown voltage can be prevented is provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
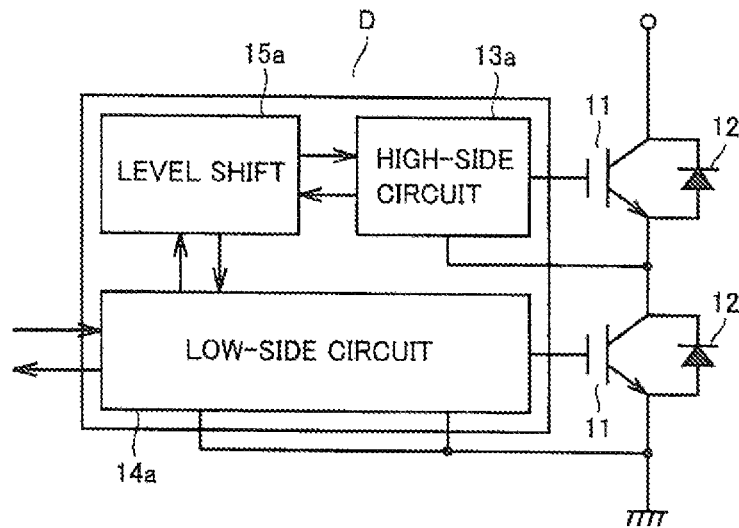
FIG. 1 is a block diagram showing one example of a semiconductor device with a high breakdown voltage element, according to each embodiment of the present invention.

First, as one example of a semiconductor device with a lateral high breakdown voltage element in each embodiment, the configuration (block diagram) of a driver circuit for operating a load such as an induction motor or the like will be described. As shown in FIG. 1, a drive control circuit in semiconductor device D includes a low-side circuit 14a that controls switching operation of an IGBT 11, using a potential of a semiconductor substrate as a reference, a high-side circuit 13a that controls switching operation of an IGBT 11, using a prescribed potential (high voltage) higher than the potential of the semiconductor substrate as a reference, and a level shift circuit 15a that transmits a signal between high-side circuit 13a and low-side circuit 14a. A free wheel diode 12 is connected to each IGBT 11.

Figure 2:
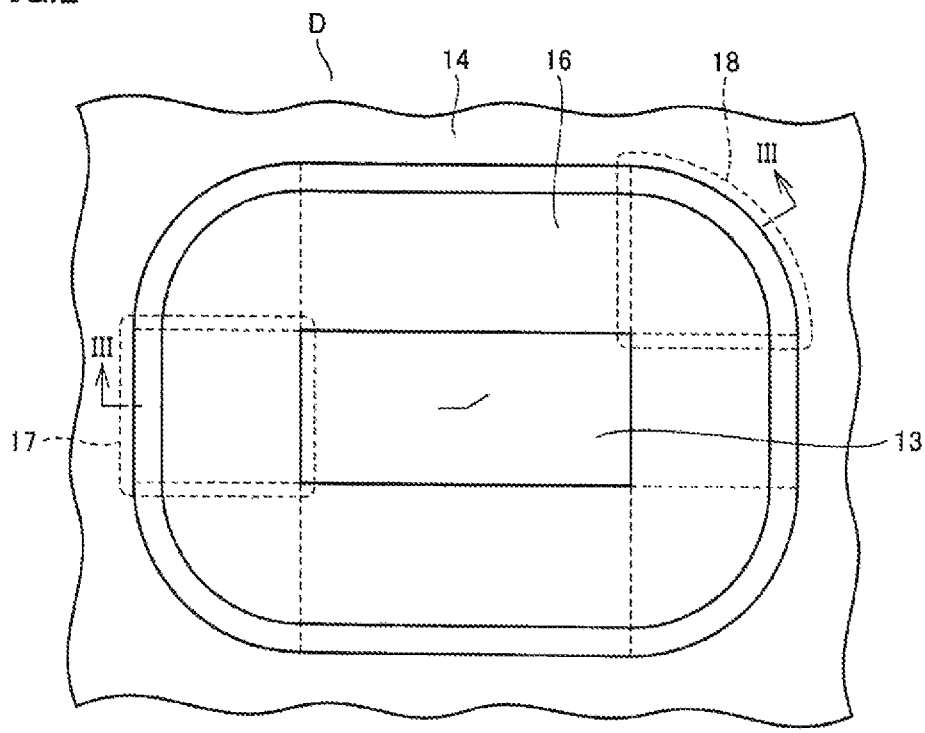
FIG. 2 is a plan view of the semiconductor device with the high breakdown voltage element, according to each embodiment of the present invention.
Figure 3:
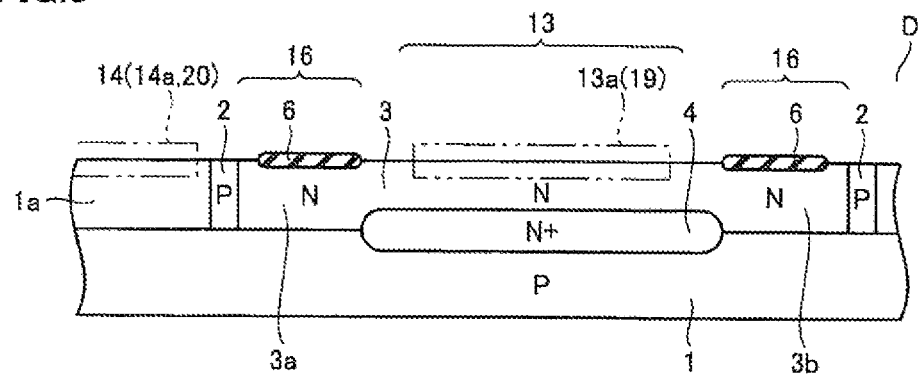
FIG. 3 is a cross-sectional view along a cross-sectional line III-III shown in FIG. 2.

The outline of the structure of semiconductor device D according to each embodiment will be described next. As shown in FIGS. 2 and 3, a P type epitaxial layer 1a (first semiconductor layer) is formed to cover a surface of a P type semiconductor substrate 1. A low-side circuit region 14 (first region) is disposed in a prescribed position in P type epitaxial layer 1a. In low-side circuit region 14, a low-side circuit 14a including a semiconductor device 20 driven with a low voltage is formed.

An N type diffusion layer 3 (second semiconductor layer) is formed from a surface of P type epitaxial layer 1a to reach a surface of semiconductor substrate 1. An N+ buried diffusion layer 4 is formed between N type diffusion layer 3 and semiconductor substrate 1. A high-side circuit region 13 (second region) is disposed in N type diffusion layer 3. In high-side circuit region 13, a high-side circuit 13a including semiconductor device 19 driven with a high voltage is formed. An N type high breakdown voltage isolation region 16 (isolation region) is formed with a prescribed width along high-side circuit region 13, so as to surround high-side circuit region 13.

Here, high-side circuit region 13 has a rectangular layout pattern. Thus, high breakdown voltage isolation region 16 with the prescribed width includes a fan-shaped corner portion (fourth semiconductor layer) 18 located along a corner pattern of rectangular high-side circuit region 13, and a linear portion (third semiconductor layer) 17 located along a linear pattern thereof.

A thermal oxide film 6 is formed on a surface of high breakdown voltage isolation region 16. On the surface of thermal oxide film 6, a field plate (not shown) of a metal or polysilicon, for example, is formed. P type diffusion layer 2 (first semiconductor layer) is formed to surround high breakdown voltage isolation region 16. An insulating layer (not shown) is formed to cover high-side circuit region 13 and low-side circuit region 14.

In semiconductor device D according to each embodiment, at N type diffusion layer 3b of corner portion 18 and N type diffusion layer 3a of linear portion 17 in high breakdown voltage isolation region 16, the concentration of the N type impurity and the thickness of each layer satisfy a resurf condition. Moreover, the impurity concentration in N type diffusion layer 3b of corner portion 18 (concentration A) and the impurity concentration in N type diffusion layer 3a of linear portion 17 (concentration B) are different from each other.

While P type epitaxial layer 1a is described as an example of a layer in which low-side circuit region 14 is disposed, the layer is not limited to such an epitaxial layer, and may also be an impurity diffused layer, for example.

The structure of semiconductor device D with the high breakdown voltage isolation region will be more specifically described below. In each figure, the same components are indicated with the same reference numbers, and the description thereof will not be repeated unless required.

First Embodiment

Figure 4:
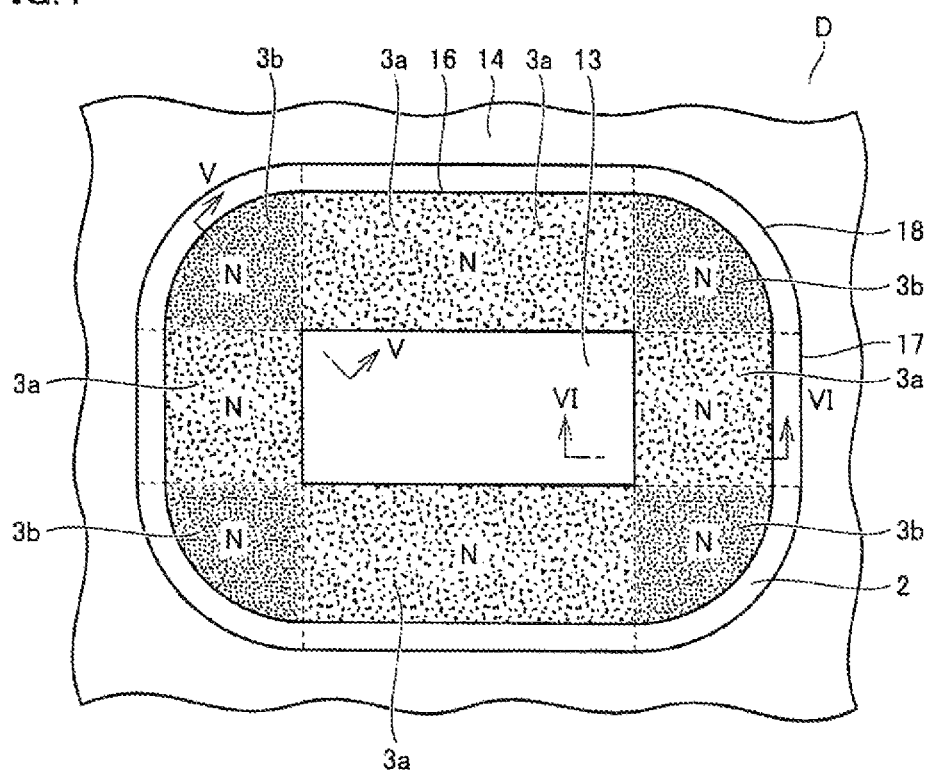
FIG. 4 is a plan view of a semiconductor device with a high breakdown voltage element, according to a first embodiment of the present invention.
Figure 5:
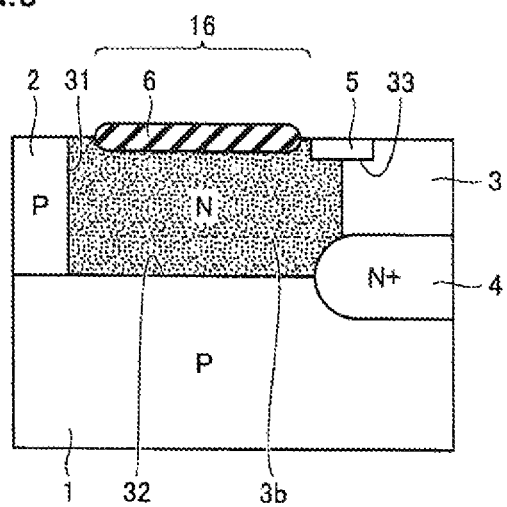
FIG. 5 is a cross-sectional view along a cross-sectional line V-V shown in FIG. 4, according to the first embodiment.
Figure 6:
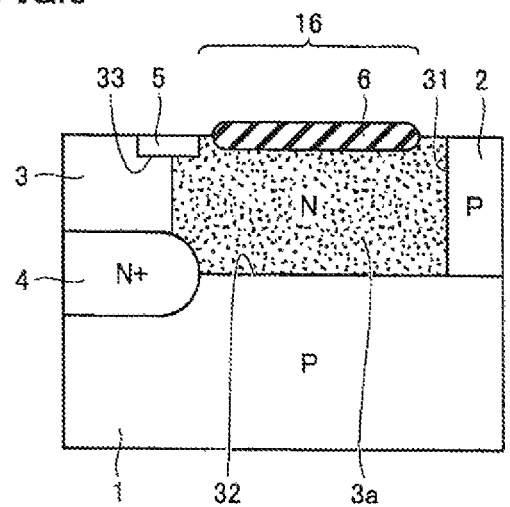
FIG. 6 is a cross-sectional view along a cross-sectional line VI-VI shown in FIG. 4, according to the first embodiment.

Semiconductor device D according to a first embodiment will be described. As shown in FIGS. 4, 5 and 6, high breakdown voltage isolation region 16 includes, as a layout pattern, fan-shaped corner portion 18 having a central angle of substantially 90 degrees, located along the corner pattern of rectangular high-side circuit region 13, and linear portion 17 located along the linear pattern thereof. N+ type diffusion layer 5 to which a high voltage is applied is formed in high-side circuit region 13.

The impurity concentration in N type diffusion layer 3b of corner portion 18 is set to be about twice as high as the impurity concentration in N type diffusion layer 3a of linear portion 17. Consequently, the number of impurity atoms of N type diffusion layer 3b becomes the same as the number of impurity atoms in a prescribed volume of N type diffusion layer 3a, so that a decrease in breakdown voltage can be prevented. This will now be described.

Figure 7:
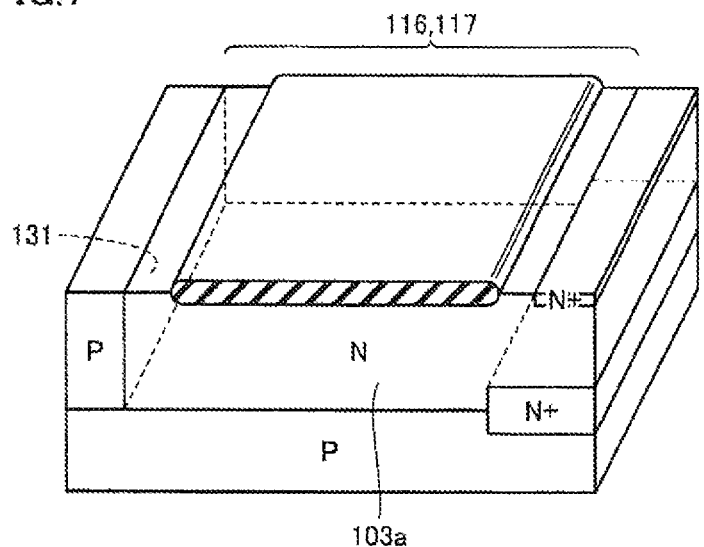
FIG. 7 is a cross-sectional perspective view showing a linear portion for use in illustrating a problem of the semiconductor device.
Figure 8:
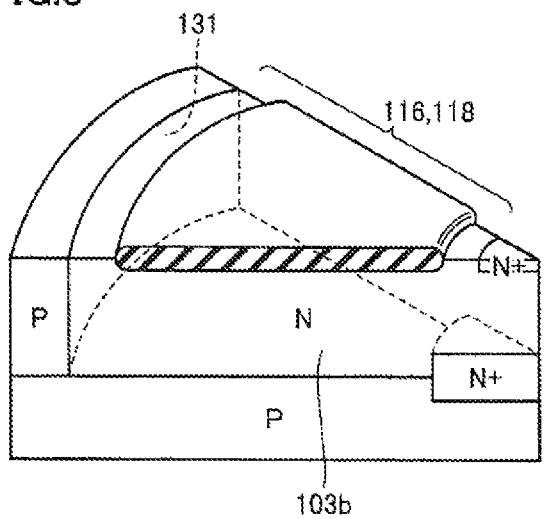
FIG. 8 is a cross-sectional perspective view showing a corner portion for use in illustrating a problem of the semiconductor device.

N type diffusion layers 3a and 3b in high breakdown voltage isolation region 16 are joined to P type diffusion layer 2, thus forming a PN junction. In FIGS. 7 and 8, a portion of the linear portion (linear portion 117) and a portion of the corner portion (corner portion 118) in high breakdown voltage isolation region 116, each having a PN junction surface 131 of the same area as the area of the PN junction, are taken out. As shown in FIGS. 7 and 8, when the area of PN junction surface 131 of linear portion 117 and the area of PN junction surface 131 of corner portion 118 are the same, the volume of an N type diffusion layer 103b of corner portion 118 is smaller than the volume of an N type diffusion layer 103a of linear portion 117.

The impurity concentration is defined as the number of impurity atoms per unit volume (/cm³). Hence, when the impurity concentration in N type diffusion layer 103a in linear portion 117 and the impurity concentration in N type diffusion layer 103b in corner portion 118 are the same, the number of atoms of the N type impurity included in N type diffusion layer 103b of corner portion 118 is smaller than the number of atoms of the N type impurity included in N type diffusion layer 103a of linear portion 117.

Thus, when a reverse voltage is applied to PN junction surface 131, the extension of the depletion layer extending from PN junction surface 131 differs between linear portion 117 and corner portion 118, and linear portion 117 and corner portion 118 cannot be adjusted to have the maximum breakdown voltage simultaneously. In this case, the breakdown voltage of corner portion 118 is determined as the breakdown voltage.

Figure 9:
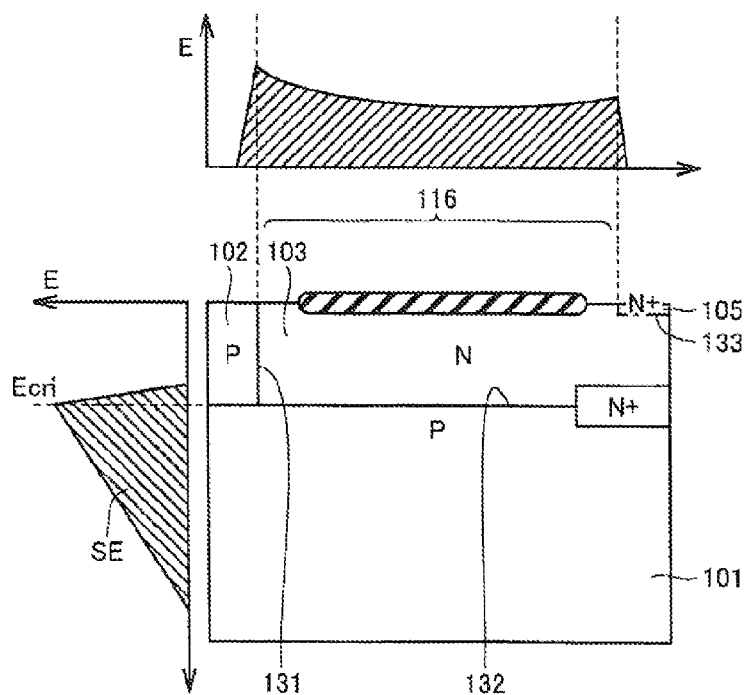
FIG. 9 is a first diagram showing an electric field profile generated at each of a PN junction surface and an N+/N interface, for use in illustrating a function and an effect of the semiconductor device, according to the first embodiment.

Next, an electric field strength at the PN junction when a high voltage is applied to the high breakdown voltage isolation region, where the impurity concentration and the thickness of the N type diffusion layer are optimized to satisfy the resurf condition, will be described. As shown in FIG. 9, a PN junction surface 132 (horizontal direction) of P type semiconductor substrate 101 and N type diffusion layer 103, and a PN junction surface 131 (perpendicular direction) of N type diffusion layer 103 and P type diffusion layer 102 are present in high breakdown voltage isolation region 116.

A reference voltage is applied to P type diffusion layer 102, and a high voltage is applied to N+ type diffusion layer 105. When each of these voltages is applied, the depletion layer spreads in a lateral direction from PN junction surface 131 toward N type diffusion layer 103 to reach an N+/N interface 133, so that N type diffusion layer 103 is completely depleted. At this time, owing to a resurf effect, the electric field strength generated at PN junction surface 131 is smaller than the electric field strength generated at PN junction surface 132, and the electric field strength generated at PN junction surface 131 and the electric field strength generated at PN junction surface 132 are lower than a critical electric field Ecri of silicon (Si).

When the applied voltage is further increased, the electric field strength generated at PN junction surface 132 becomes higher than the electric field strength generated at PN junction surface 131 to reach critical electric field Ecri of silicon (Si), which causes avalanche breakdown. The voltage applied at this time is determined as the breakdown voltage. This breakdown voltage corresponds to a value obtained by integrating the electric field strength generated at PN junction surface 132 in the perpendicular direction (area SE). It is noted that the impurity concentration and the thickness of N type diffusion layer 103 are adjusted such that when the applied voltage is increased, the electric field strength at N+/N interface 133 also increases, but becomes lower than the electric field strength generated at PN junction surface 132.

Figure 10:
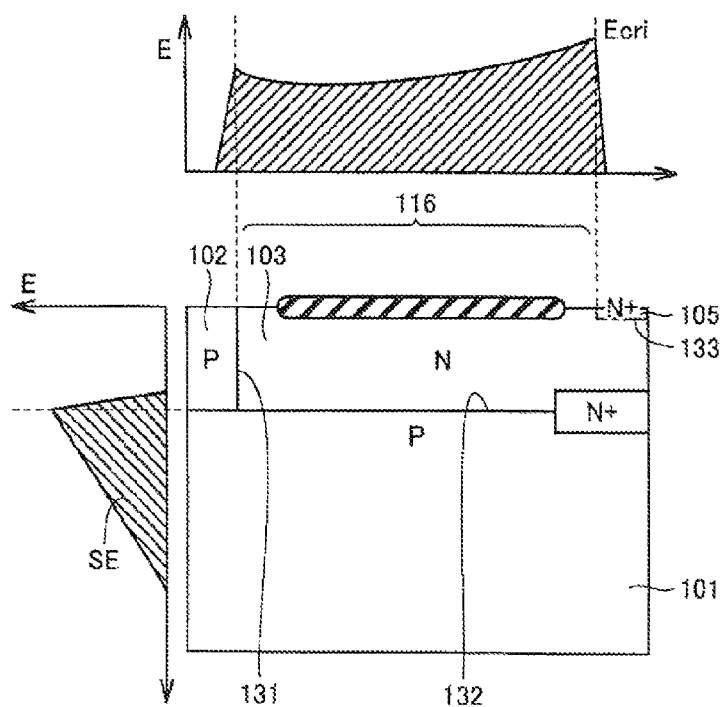
FIG. 10 is a second diagram showing an electric field profile generated at each of the PN junction surface and the N+/N interface, for use in illustrating the function and the effect of the semiconductor device, according to the first embodiment.

Next, the case where the impurity concentration in N type diffusion layer 103 is lower will be described. When the impurity concentration in N type diffusion layer 103 is lower, the depletion layer spreads more easily from PN junction surface 131 to N type diffusion layer 103. In this case, as shown in FIG. 10, the electric field generated at N+/N interface 133 reaches critical electric field Ecri of silicon (Si) before the electric field strength generated at PN junction surface 132 reaches critical electric field Ecri of silicon (Si), which causes avalanche breakdown. Consequently, the breakdown voltage of high breakdown voltage isolation region 116 is lower than the case where the impurity concentration and the thickness of N type diffusion layer 103 are optimized.

Figure 11:
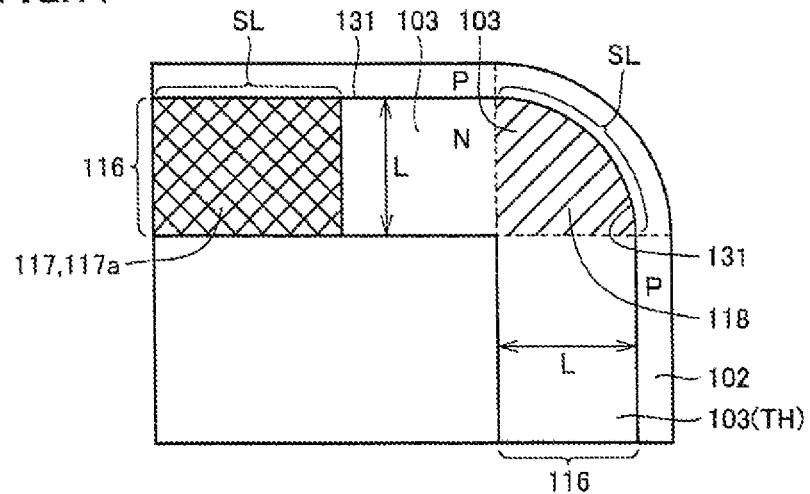
FIG. 11 is a partial plan view showing a high breakdown voltage isolation region, for use in illustrating the function and the effect of the semiconductor device, according to the first embodiment.

Next, the number of atoms of the N type impurity in each of the linear portion and the corner portion will be described. FIG. 11 shows a portion of high breakdown voltage isolation region 116 including corner portion 118 and linear portion 117. In general, when the number of impurity atoms in the impurity region is referred to as n, a width W of the depletion layer that extends to the impurity region when a certain voltage is applied to the PN junction can be approximated by $W \propto (1/n)^{1/2}$.

Here, a portion of linear portion 117 having a junction surface of the same area as the junction area of PN junction surface 131 (perpendicular direction) of corner portion 118 and P type diffusion layer 102 is referred to as linear portion 117a. Furthermore, the width of high breakdown voltage isolation region 116 is referred to as width L, the length on the layout of PN junction surface 131 is referred to as length SL (=L×π/2), the thickness of N type diffusion layer 103 is referred to as thickness TH, and the impurity concentration in N type diffusion layer 103 is referred to as concentration CN.

In this case, the number of impurity atoms in corner portion 118 is $\pi \times L^2 \times TH \times CN/4$, and the number of impurity atoms in linear portion 117a is $\pi \times L^2 \times TH \times CN/2$. Consequently, the extension of the depletion layer in corner portion 118 is $2^{1/2}$ times as long as the extension of the depletion layer in linear portion 117a.

Furthermore, in linear portion 117, N+ type diffusion layer 105 to which a high voltage is applied is disposed along linear portion 117 (see FIG. 7), whereas in corner portion 118, N+ type diffusion layer 105 is formed with a certain radius of curvature. Thus, the electric field strength generated at the N+/N interface becomes stronger in corner portion 118 than in linear portion 117.

In this case, when the impurity concentration is set to be the same in linear portion 117 and corner portion 118, the number of impurity atoms in corner portion 118 becomes smaller, so that in corner portion 118, the electric field strength generated at the N+/N interface reaches critical electric field strength Ecri of silicon (Si) before the electric field strength generated at PN junction surface 132 reaches critical electric field Ecri of silicon (Si). Consequently, the breakdown voltage decreases.

In high breakdown voltage isolation region 16 of semiconductor device D described above, the number of impurity atoms (A) included in N type diffusion layer 3b and the number of impurity atoms (B) included in N type diffusion layer 3a are set to be the same, such that the width of the depletion layer that extends to N type diffusion layer 3b of corner portion 18, and the width of the depletion layer that extends to N type diffusion layer 3a of linear portion 17 become the same. As referred to herein, the same number does not intend to mean exactly the same number, but includes a deviation (variation) produced during manufacture.

To make the number of impurity atoms (A) and the number of impurity atoms (B) the same, the impurity concentration in N type diffusion layer 3b of corner portion 18 may be set to be about twice as high as the impurity concentration in N type diffusion layer 3a of linear portion 17, based on an estimation of the number of impurity atoms described above. In this way, the electric field strength generated at the N+/N interface located near corner portion 18 can be reduced, and variations in breakdown voltage can also be reduced. Consequently, a decrease in the breakdown voltage of semiconductor device D can be prevented.

Figure 12:
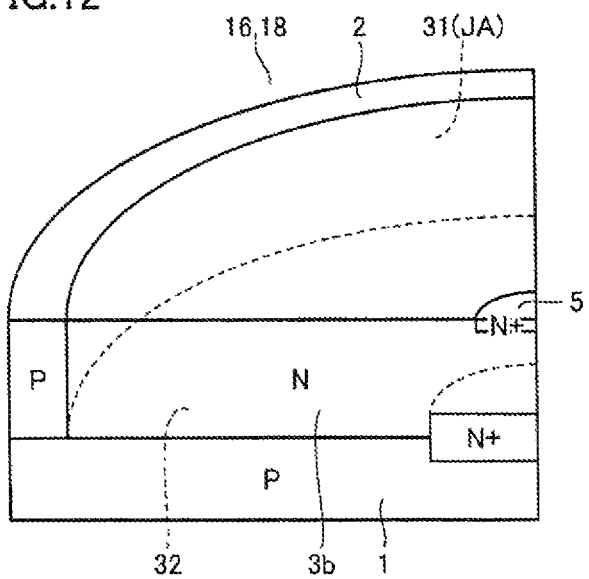
FIG. 12 is a cross-sectional perspective view showing the corner portion for use in illustrating the function and the effect of the semiconductor device, according to the first embodiment.
Figure 13:
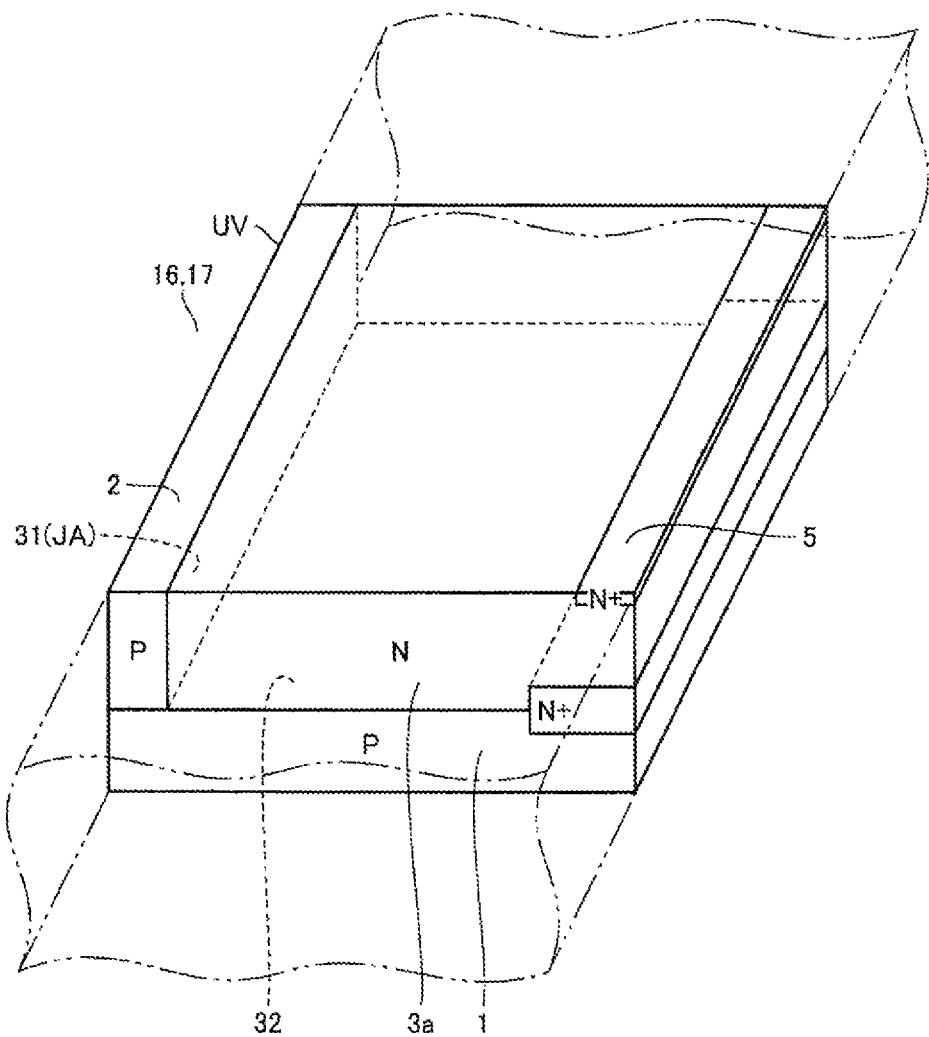
FIG. 13 is a cross-sectional perspective view showing the linear portion for use in illustrating the function and the effect of the semiconductor device, according to the first embodiment.

This structure will be described below in a little more detail. As shown in FIG. 12, the area of a junction surface where N type diffusion layer 3b and P type diffusion layer 2 in corner portion 18 join to each other is referred to as an area JA. As shown in FIG. 13, a region (volume) having a width and a thickness, in which the area of a junction surface where N type diffusion layer 3a and P type diffusion layer 2 join to each other corresponds to the same area as area JA in N type diffusion layer 3a of linear portion 17, is referred to as a region UV.

In this case, the impurity concentration and the thickness of N type diffusion layer 3b of corner portion 18, and the impurity concentration and the thickness of N type diffusion layer 3a of linear portion 17 are set in such a manner that the number of atoms of the N type impurity in N type diffusion layer 3b of corner portion 18, and the number of atoms of the N type impurity in region UV of N type diffusion layer 3a of linear portion 17 become the same. It is noted that region UV may be in any position of linear portion 17, and does not intend to mean a region in a specific position.

The function and the effect of semiconductor device D discussed above can be a little more qualitatively described as follows.

Firstly, the impurity concentration and the thickness of N type diffusion layer 3a in linear portion 17 are optimized as follows. When a reference potential is applied to P type diffusion layer 2 and a high voltage is applied to N+ type diffusion layer 5, the electric field generated at PN junction surface 32 of N type diffusion layer 3a and P type semiconductor substrate 1 is referred to as an electric field A, the electric field generated at PN junction surface 31 of N type diffusion layer 3a and P type diffusion layer 2 is referred to as an electric field B, and the electric field generated at interface 33 of N type diffusion layer 3 and the N+ type diffusion layer is referred to as an electric field C. In this case, the impurity concentration and the thickness are set such that electric field A involves the critical electric field.

However, when the optimized conditions for the impurity concentration and the thickness of N type diffusion layer 3a of linear portion 17 are applied to N type diffusion layer 3b of corner portion 18, the electric field generated at the interface of N type diffusion layer 3b and N+ type diffusion layer 5 in corner portion 18 will reach the critical electric field.

Secondly, the impurity concentration and the thickness of N type diffusion layer 3b in corner portion 18 are optimized as follows. When a reference potential is applied to P type diffusion layer 2 and a high voltage is applied to N+ type diffusion layer 5, the electric field generated at PN junction surface 32 of N type diffusion layer 3b and P type semiconductor substrate 1 is referred to as an electric field D, the electric field generated at PN junction surface 31 of N type diffusion layer 3b and P type diffusion layer 2 is referred to as an electric field E, and the electric field generated at interface 33 of N type diffusion layer 3 and the N+ type diffusion layer is referred to as an electric field F. In this case, the impurity concentration and the thickness are set such that electric field D involves the critical electric field.

However, when the optimized conditions for the impurity concentration and the thickness of N type diffusion layer 3b of corner portion 18 are applied to N type diffusion layer 3a of linear portion 17, the impurity concentration in N type diffusion layer 3a of linear portion 17 will increase, and the resurf condition will not be satisfied. Consequently, the breakdown voltage is expected to decrease sharply.

In high breakdown voltage isolation region 16 of semiconductor device D described above, the impurity concentration and the thickness of each of N type diffusion layers 3a and 3b are set such that electric field A becomes higher than electric field B and electric field C, electric field D becomes higher than electric field E and electric field F, and electric field A and electric field D both involve the critical electric field. In this way, the electric field generated at the N+/N interface can be prevented from reaching the critical electric field. Consequently, a decrease in the breakdown voltage of semiconductor device D can be prevented.

Figure 14:
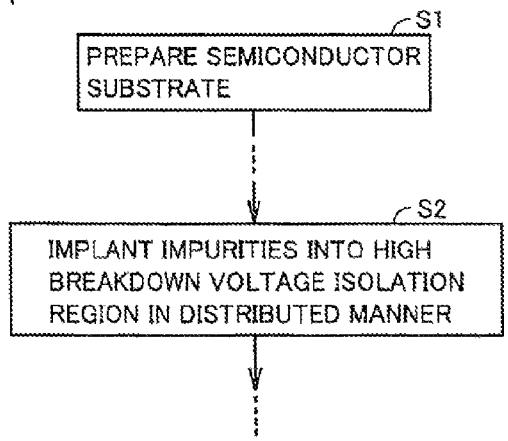
FIG. 14 is a flow chart of principle steps of a method for manufacturing a semiconductor device, according to the first embodiment.

Next, principle steps of a method for manufacturing the foregoing semiconductor device D will be described. FIG. 14 shows a flow chart of the principle steps. As shown in FIG. 14, in Step S1, a P type semiconductor substrate is prepared first. Then, a process is performed for introducing a prescribed impurity for forming a resurf structure, a semiconductor device in a low-side circuit region, and a semiconductor device in a high-side circuit region. During this process, impurities are introduced (implanted) into the high breakdown voltage isolation region in a distributed manner (Step S2).

Figure 15:
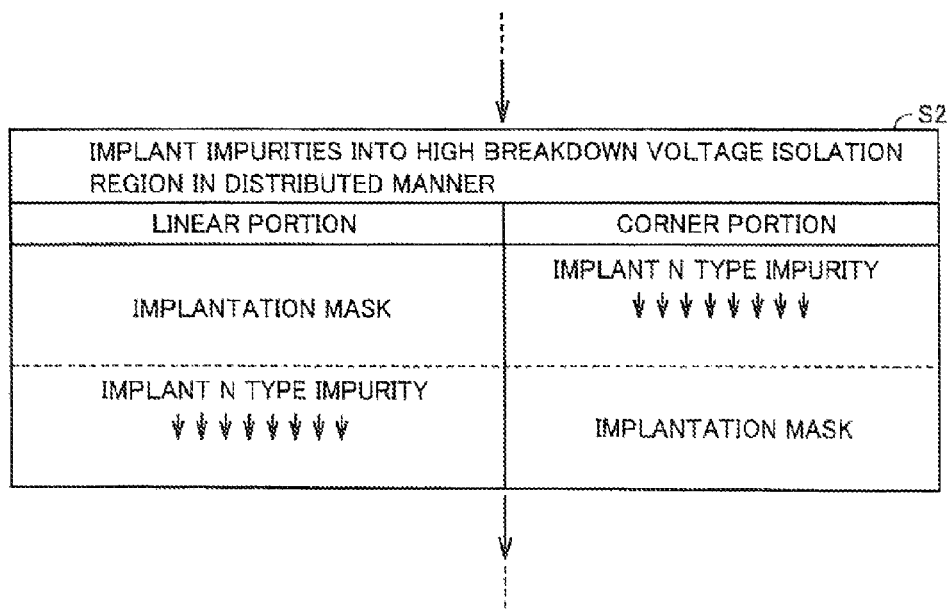
FIG. 15 is a diagram showing flows of distributing impurities into the high breakdown voltage isolation region, according to the first embodiment.
Figure 16:
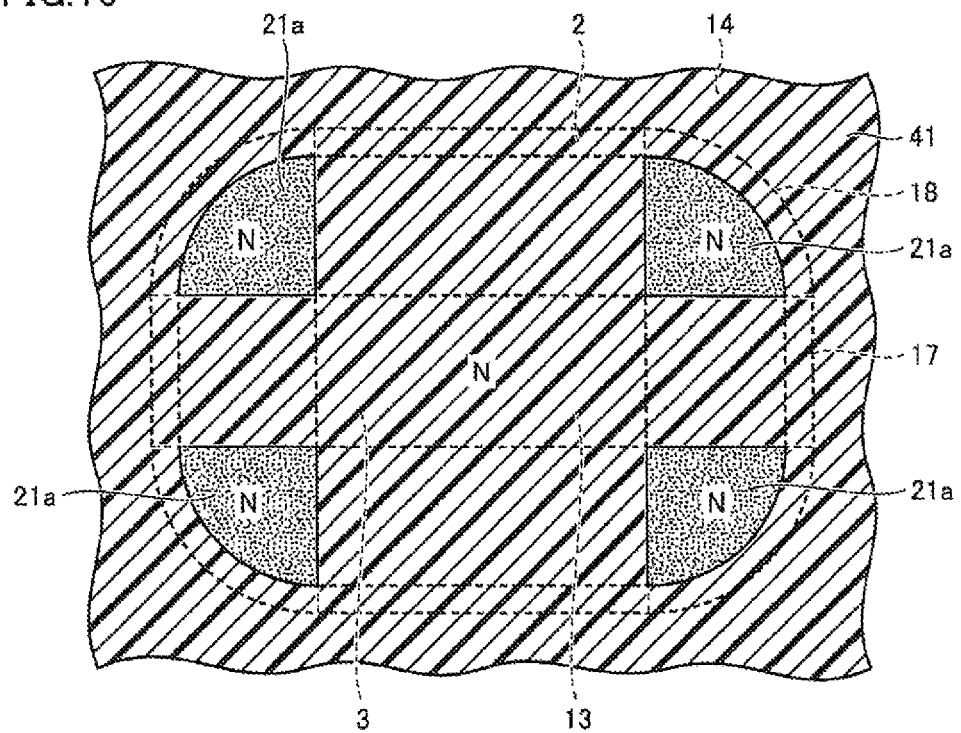
FIG. 16 is a plan view showing one step of distributing impurities into the high breakdown voltage isolation region, according to the first embodiment.

Next, a first example of distributing impurities will be described specifically. As shown in FIGS. 15 and 16, corner portion 18 is exposed, and a resist pattern 41 is formed to cover linear portion 17. Next, with resist pattern 41 as an implantation mask, an N type impurity 21a is implanted into corner portion 18 under a condition such that an optimized impurity concentration (approximately $2 \times 10^{12}$ cm$^{-2}$, for example) is obtained for N type diffusion layer 3b of corner portion 18. Resist pattern 41 is then removed.

Figure 17:
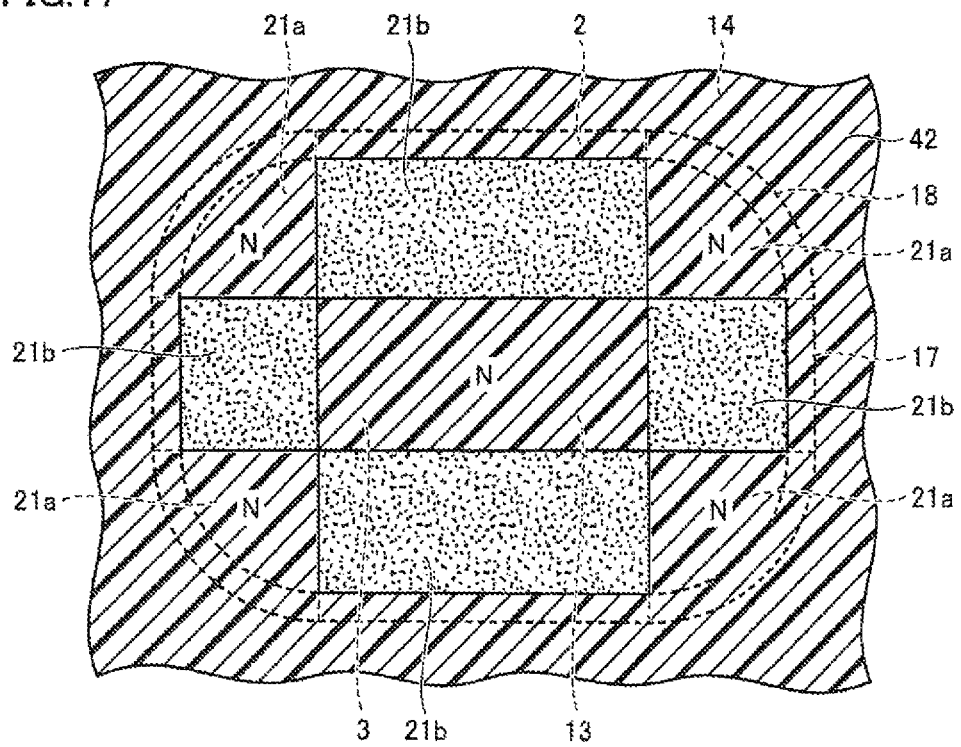
FIG. 17 is a plan view showing a step performed after the step shown in FIG. 16, according to the first embodiment.

Next, as shown in FIGS. 15 and 17, a resist pattern 42 is formed to cover corner portion 18 and expose linear portion 17. Next, with the resist pattern as an implantation mask, an N type impurity 21b is implanted into linear portion 17 under a condition such that an optimized impurity concentration (approximately $1 \times 10^{12}$ cm$^{-2}$, for example) is obtained for N type diffusion layer 3a of linear portion 17.

Figures 18, 19:
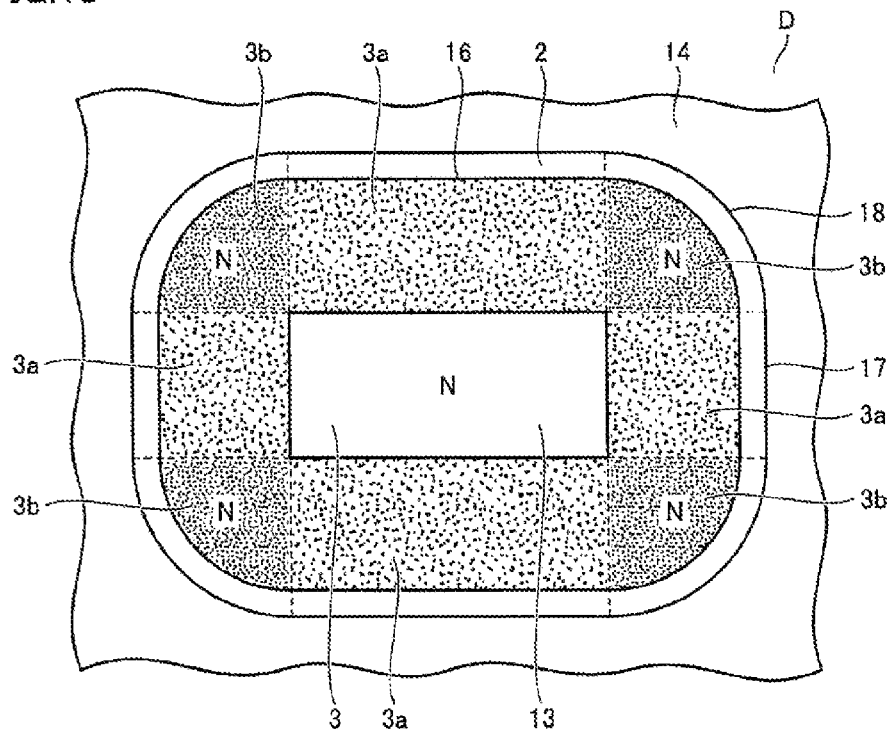
FIG. 18 is a plan view showing a step performed after the step shown in FIG. 17, according to the first embodiment.
FIG. 19 is a diagram showing flows of distributing impurities into the high breakdown voltage isolation region in a method for manufacturing a semiconductor device with a high breakdown voltage element, according to a second embodiment of the present invention.

Next, resist pattern 42 is removed to thereby form high breakdown voltage isolation region 16 electrically isolating high-side circuit region 13 and low-side circuit region 14, as shown in FIG. 18. It is noted that the impurity concentration in N type diffusion layer 3 of high-side circuit region 13 may be any of the impurity concentration in N type diffusion layer 3a and the impurity concentration in N type diffusion layer 3b.

As described already, in semiconductor device D thus manufactured, the width of the depletion layer that extends in corner portion 18 and the width of the depletion layer that extends in linear portion 17 are substantially the same, so that a decrease in breakdown voltage in corner portion 18 can be prevented.

It is noted that for convenience sake of describing the distribution of impurities into high breakdown voltage isolation region 16, resist patterns 41 and 42 covering high-side circuit region 13 and low-side circuit region 14 are shown as the resist patterns. As described above, the distribution of impurities into high breakdown voltage isolation region 16 is performed in parallel with the process for introducing the impurity for forming semiconductor devices or the like such as those in low-side circuit region 14 and high-side circuit region 13. Hence, in the actual step, resist patterns are formed to correspond to the semiconductor devices or the like in high-side circuit region 13 and low-side circuit region 14. This also applies to the manufacturing method according to each embodiment described below.

Second Embodiment

A second example of introducing (implanting) impurities into the high breakdown voltage isolation region in a distributed manner, in the principle steps of the method for manufacturing a semiconductor device, will now be described.

Figure 20:
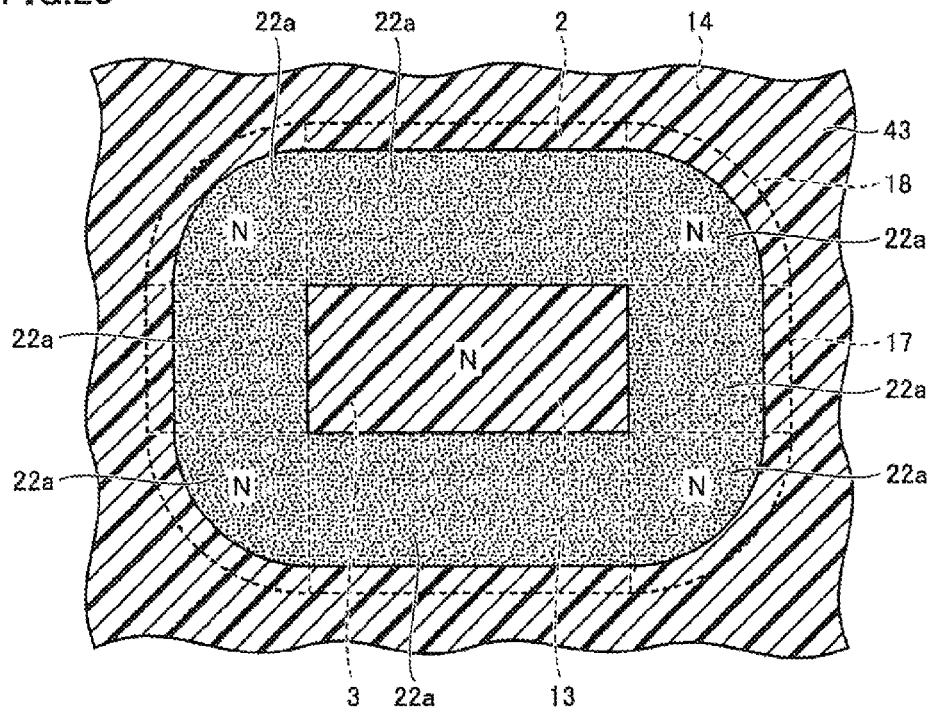
FIG. 20 is a plan view showing one step of distributing impurities into the high breakdown voltage isolation region, according to the second embodiment.

As shown in FIGS. 19 and 20, a resist pattern 43 is formed to expose corner portion 18 and linear portion 17, and cover other regions. Next, with resist pattern 43 as an implantation mask, an N type impurity 22a is implanted into corner portion 18 and linear portion 17 under a condition such that an optimized impurity concentration is obtained for N type diffusion layer 3b of corner portion 18. Resist pattern 43 is then removed.

Figure 21:
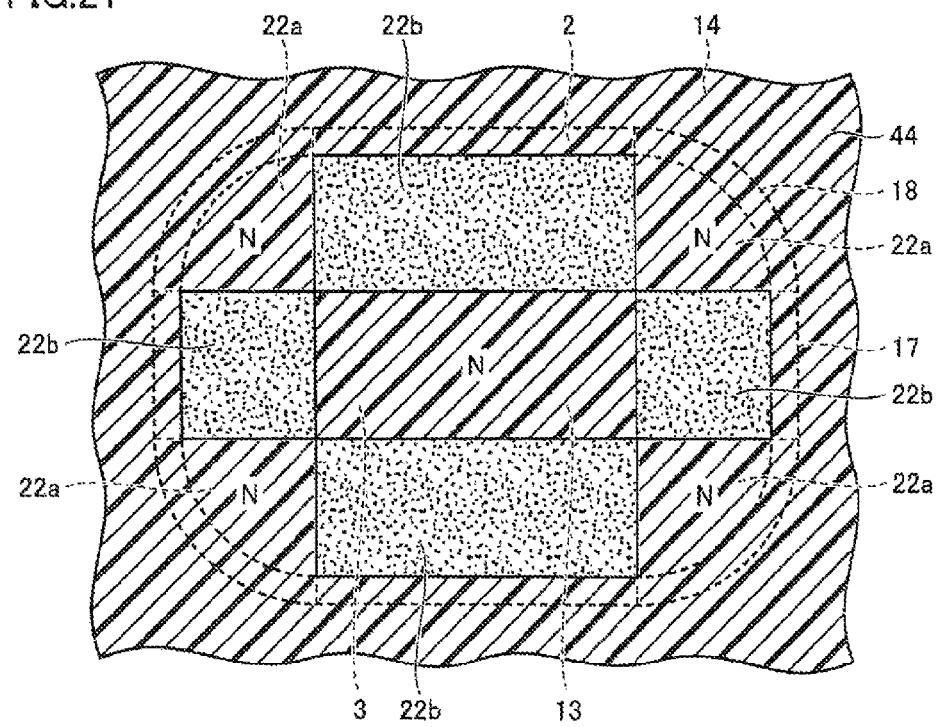
FIG. 21 is a plan view showing a step performed after the step shown in FIG. 20, according to the second embodiment.

Next, as shown in FIGS. 19 and 21, a resist pattern 44 is formed to cover corner portion 18 and expose linear portion 17. Next, with resist pattern 44 as an implantation mask, a P type impurity 22b is implanted into linear portion 17. The amount of implantation of the P type impurity at this time is set to a prescribed amount of implantation such that the net concentration of the N type impurity after the N type impurity is neutralized becomes an optimized impurity concentration for N type diffusion layer 3a of linear portion 17.

Figure 22:
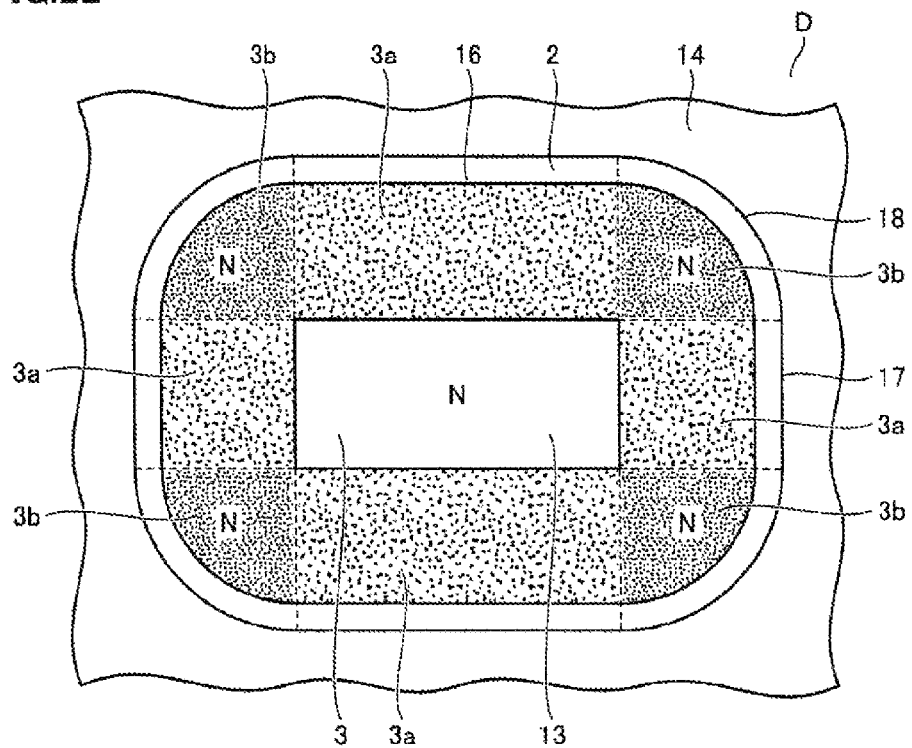
FIG. 22 is a plan view showing a step performed after the step shown in FIG. 21, according to the second embodiment.

Next, resist pattern 44 is removed to thereby form high breakdown voltage isolation region 16 electrically isolating high-side circuit region 13 and low-side circuit region 14, as shown in FIG. 22.

In semiconductor device D thus manufactured, the amount of the N type impurity implanted into corner portion 18 and the amount of the N type impurity implanted into linear portion 17 will ultimately be the same as in semiconductor device D described in the first embodiment. Consequently, the width of the depletion layer that extends in corner portion 18 and the width of the depletion layer that extends in linear portion 17 are substantially the same, so that a decrease in breakdown voltage in corner portion 18 can be prevented.

Third Embodiment

A third example of introducing (implanting) impurities into the high breakdown voltage isolation region in a distributed manner, in the principle steps of the method for manufacturing a semiconductor device, will now be described.

Figure 23:
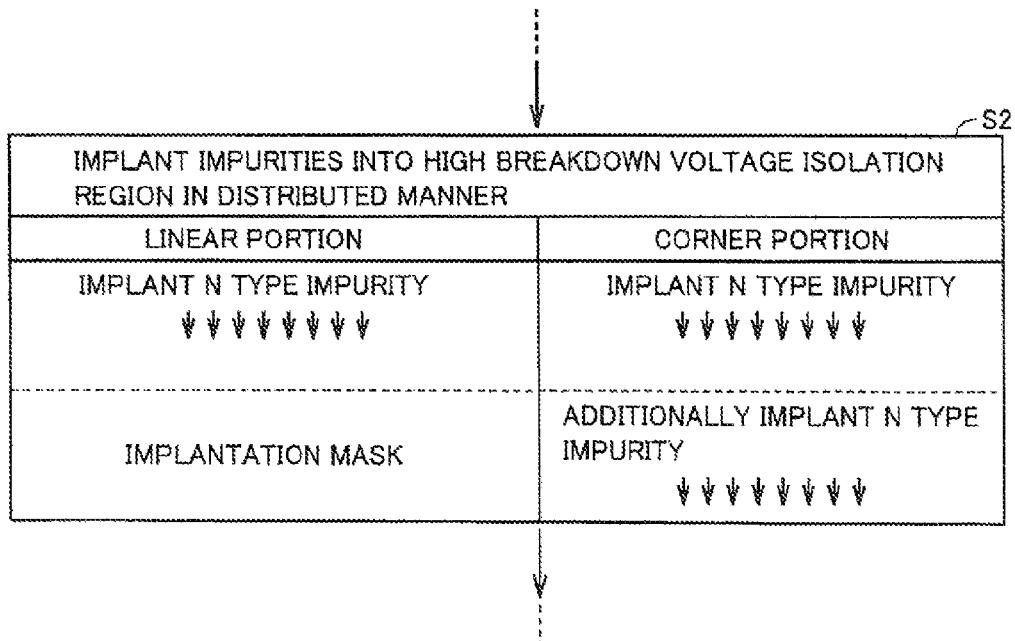
FIG. 23 is a diagram showing flows of distributing impurities into the high breakdown voltage isolation region in a method for manufacturing a semiconductor device with a high breakdown voltage element, according to a third embodiment of the present invention.
Figure 24:
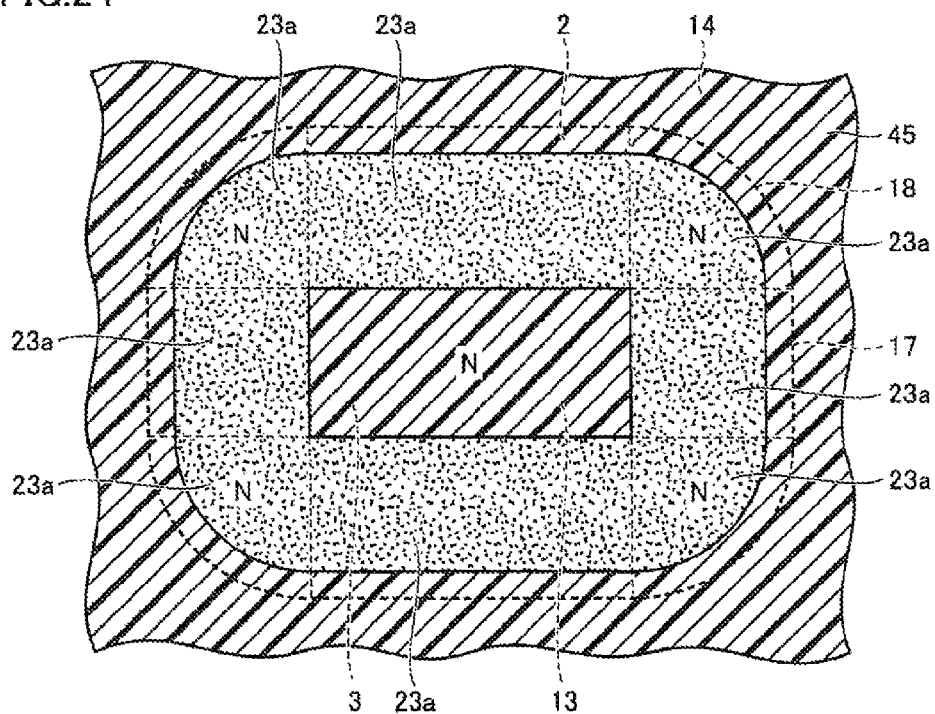
FIG. 24 is a plan view showing one step of distributing impurities into the high breakdown voltage isolation region, according to the third embodiment.

As shown in FIGS. 23 and 24, a resist pattern 45 is formed to expose corner portion 18 and linear portion 17, and cover other regions. Next, with resist pattern 45 as an implantation mask, an N type impurity 23a is implanted into corner portion 18 and linear portion 17 under a condition such that an optimized impurity concentration is obtained for N type diffusion layer 3a of linear portion 17. Resist pattern 45 is then removed.

Figure 25:
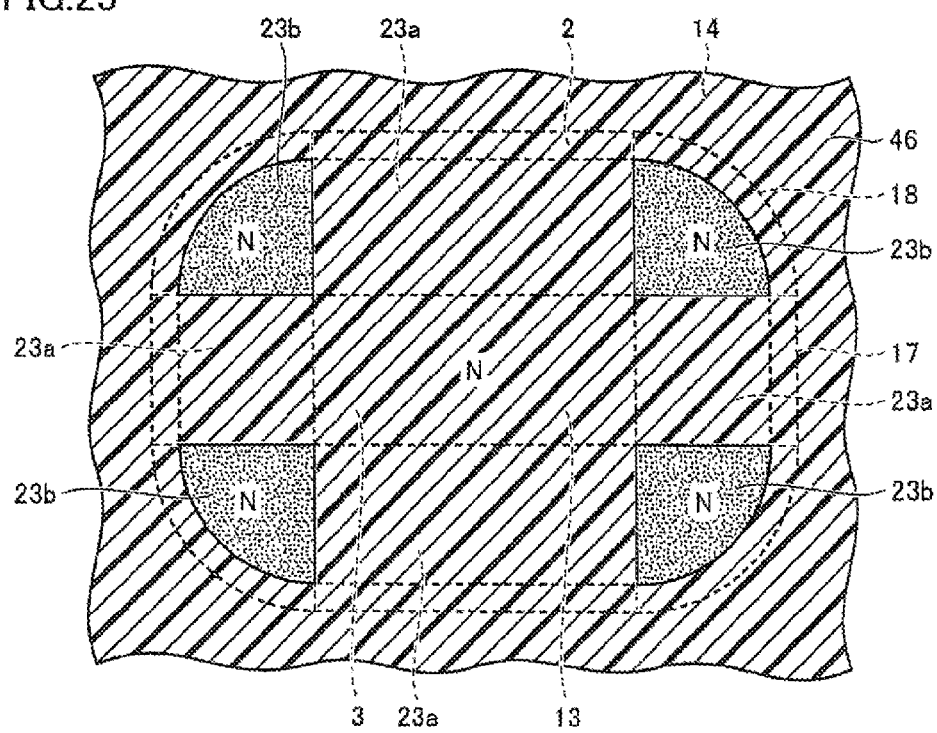
FIG. 25 is a plan view showing a step performed after the step shown in FIG. 24, according to the third embodiment.

As shown in FIGS. 23 and 25, corner portion 18 is exposed, and a resist pattern 46 is formed to cover linear portion 17. Next, with resist pattern 46 as an implantation mask, an N type impurity 23b is additionally implanted into corner portion 18. The amount of implantation of the N type impurity at this time is set to a prescribed amount of implantation such that the net concentration of the N type impurity becomes an optimized impurity concentration for N type diffusion layer 3b of corner portion 18.

Figure 26:
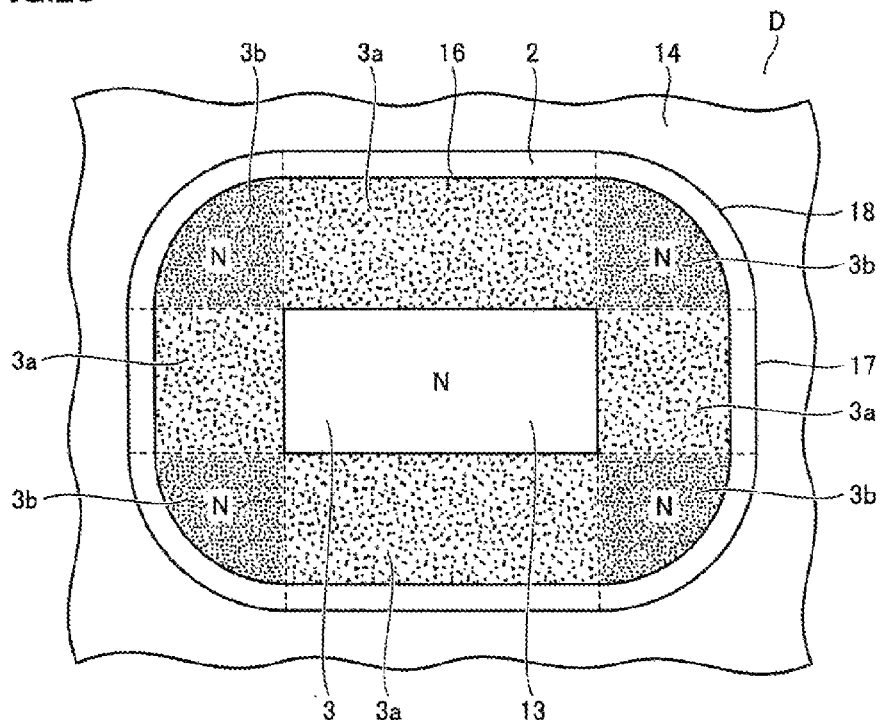
FIG. 26 is a plan view showing a step performed after the step shown in FIG. 25, according to the third embodiment.

Next, resist pattern 46 is removed to thereby form high breakdown voltage isolation region 16 electrically isolating high-side circuit region 13 and low-side circuit region 14, as shown in FIG. 26.

In semiconductor device D thus manufactured, the amount of N type impurity implanted into corner portion 18 and the amount of impurity implanted into linear portion 17 will ultimately be the same as in semiconductor device D described in the first embodiment. Consequently, the width of the depletion layer that extends in corner portion 18 and the width of the depletion layer that extends in linear portion 17 are substantially the same, so that a decrease in breakdown voltage in corner portion 18 can be prevented.

Fourth Embodiment

A fourth example of introducing (implanting) impurities into the high breakdown voltage isolation region in a distributed manner, in the principle steps of the method for manufacturing a semiconductor device, will now be described.

Figure 27:
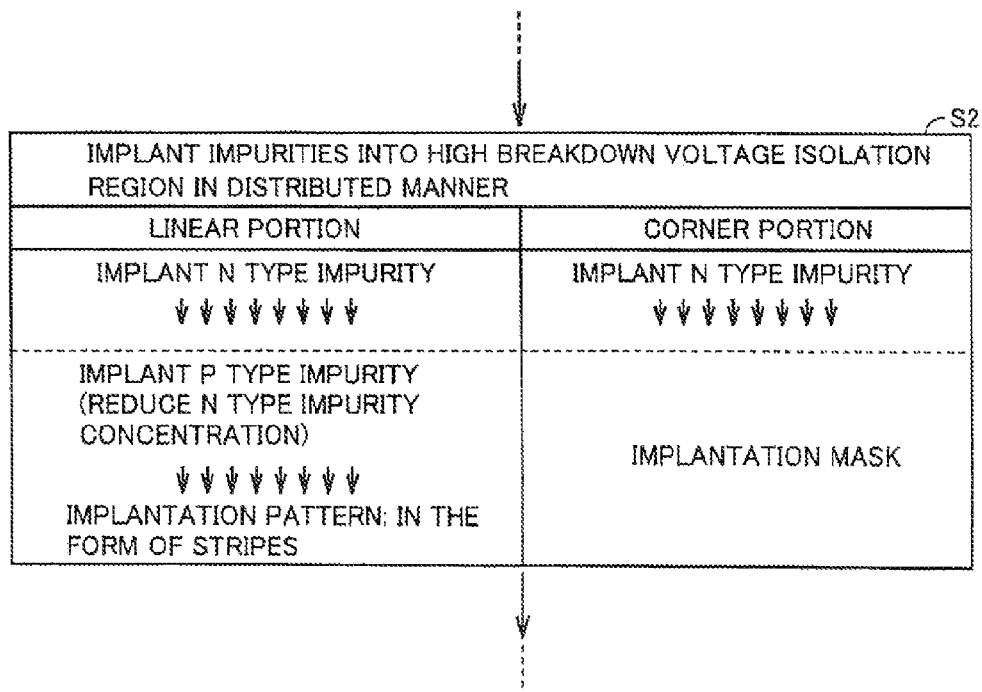
FIG. 27 is a diagram showing flows of distributing impurities into the high breakdown voltage isolation region in a method for manufacturing a semiconductor device with a high breakdown voltage element, according to a fourth embodiment of the present invention.
Figure 28:
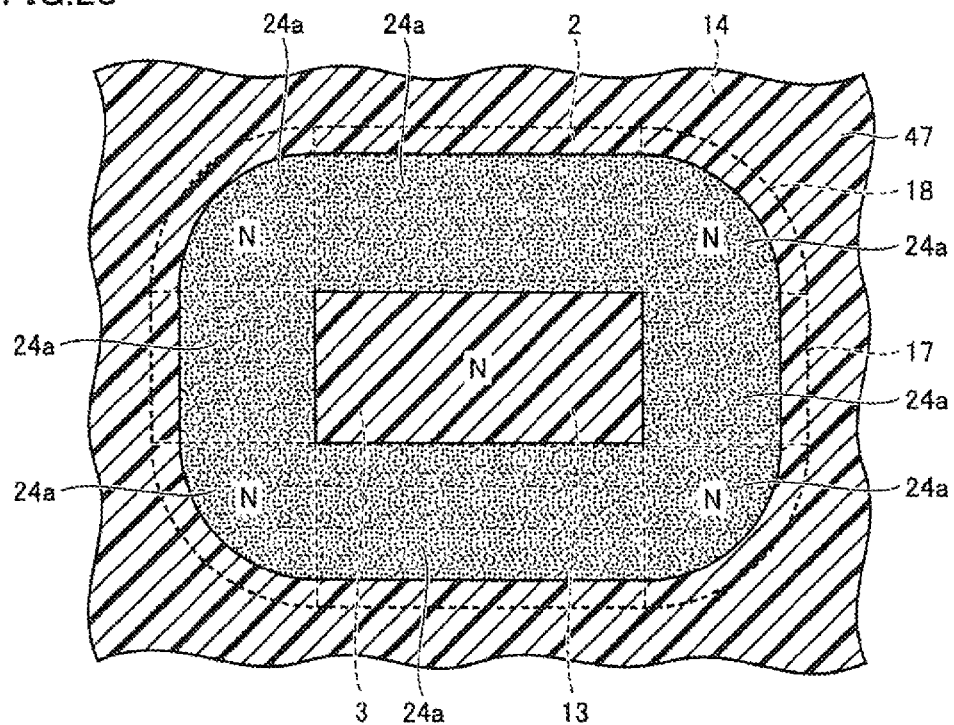
FIG. 28 is a plan view showing one step of distributing impurities into the high breakdown voltage isolation region, according to the fourth embodiment.

As shown in FIGS. 27 and 28, a resist pattern 47 is formed to expose corner portion 18 and linear portion 17, and cover other regions. Next, with resist pattern 47 as an implantation mask, an N type impurity 24a is implanted into corner portion 18 and linear portion 17 under a condition such that an optimized impurity concentration is obtained for N type diffusion layer 3b of corner portion 18. Resist pattern 47 is then removed.

Figure 29:
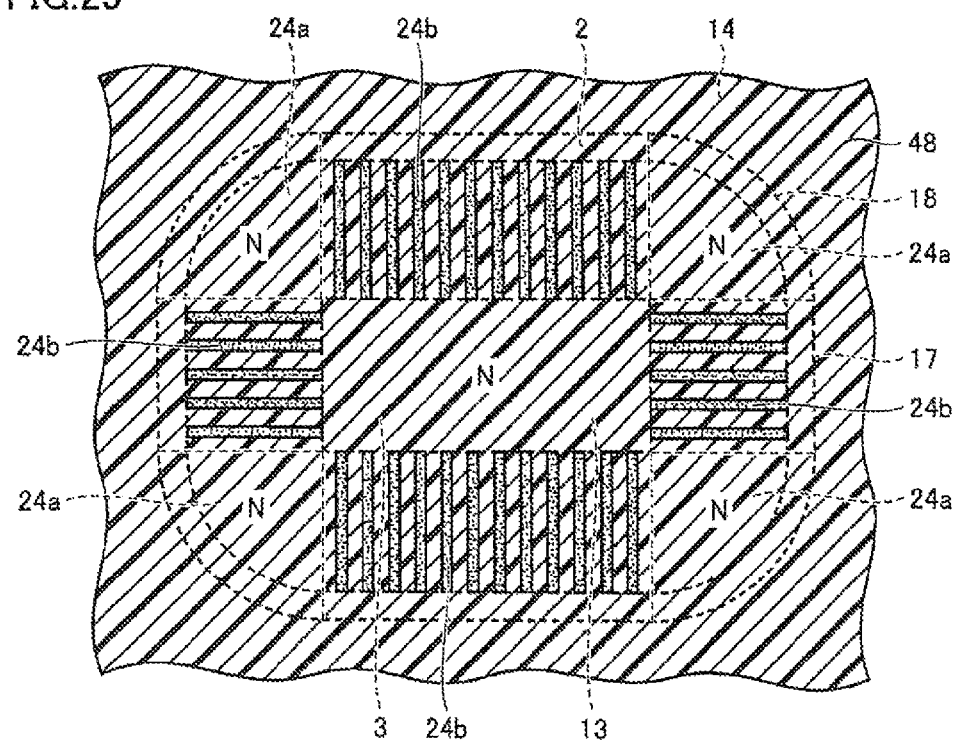
FIG. 29 is a plan view showing a step performed after the step shown in FIG. 28, according to the fourth embodiment.

Next, as shown in FIGS. 27 and 29, a resist pattern 48 is formed to cover corner portion 18, and cover linear portion 17 in the form of stripes. Next, with resist pattern 48 as an implantation mask, a P type impurity 24b is implanted into linear portion 17 in the form of stripes. The amount of implantation of the P type impurity at this time is set to a prescribed amount of implantation such that the net concentration of the N type impurity after the N type impurity is neutralized becomes an optimized impurity concentration for N type diffusion layer 3a of linear portion 17.

Figure 30:
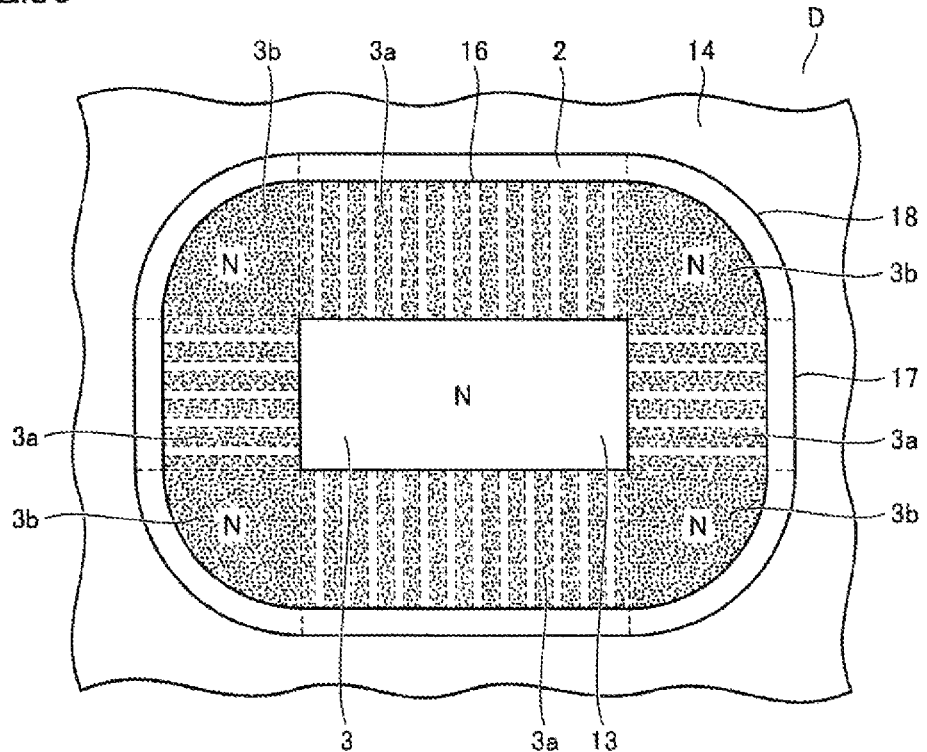
FIG. 30 is a plan view showing a step performed after the step shown in FIG. 29, according to the fourth embodiment.

Next, resist pattern 48 is removed to thereby form high breakdown voltage isolation region 16 electrically isolating high-side circuit region 13 and low-side circuit region 14, as shown in FIG. 30. Particularly in linear portion 17 of high breakdown voltage isolation region 16, a section in which the concentration of the N type impurity is relatively high and a section in which the concentration of the N type impurity is relatively low are disposed in the form of stripes.

In semiconductor device D thus manufactured, the amount of N type impurity implanted into corner portion 18 and the amount of N type impurity implanted into linear portion 17 will ultimately be the same as in semiconductor device D described in the first embodiment. Consequently, the width of the depletion layer that extends in corner portion 18 and the width of the depletion layer that extends in linear portion 17 are substantially the same, so that a decrease in breakdown voltage in corner portion 18 can be prevented.

Particularly with the method for manufacturing semiconductor device D described above, the N type impurity in N type diffusion layer 3a can be precisely adjusted by adjusting the width and the pitch of resist pattern 48 in the form of stripes in linear portion 17.

Fifth Embodiment

A fifth example of introducing (implanting) impurities into the high breakdown voltage isolation region in a distributed manner, in the principle steps of the method for manufacturing a semiconductor device, will now be described.

Figure 31:
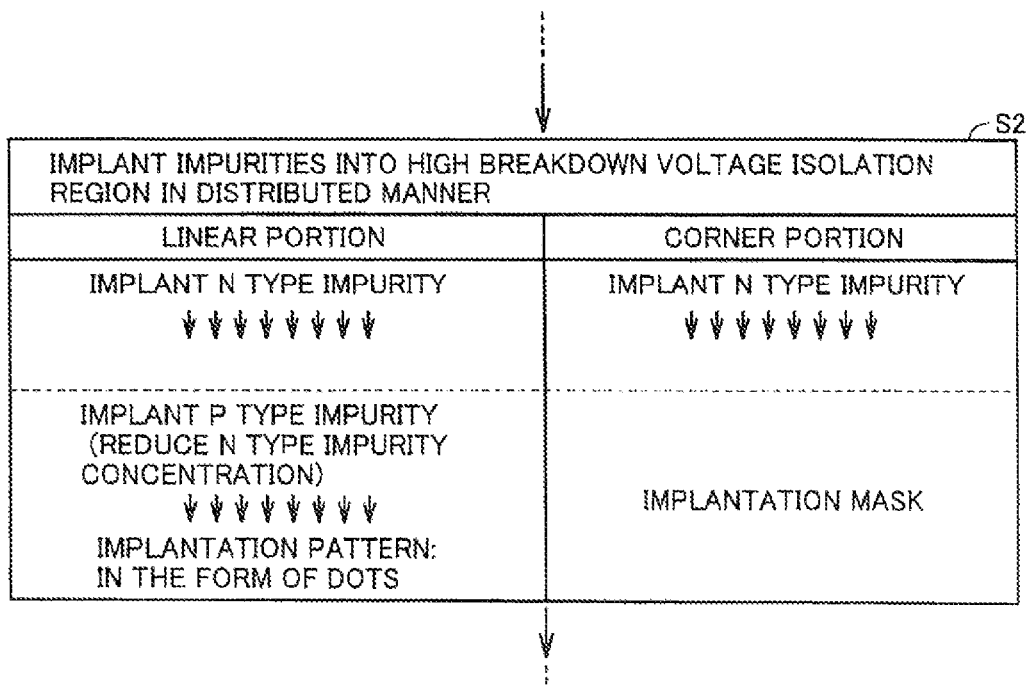
FIG. 31 is a diagram showing flows of distributing impurities into the high breakdown voltage isolation region in a method for manufacturing a semiconductor device with a high breakdown voltage element, according to a fifth embodiment of the present invention.
Figure 32:
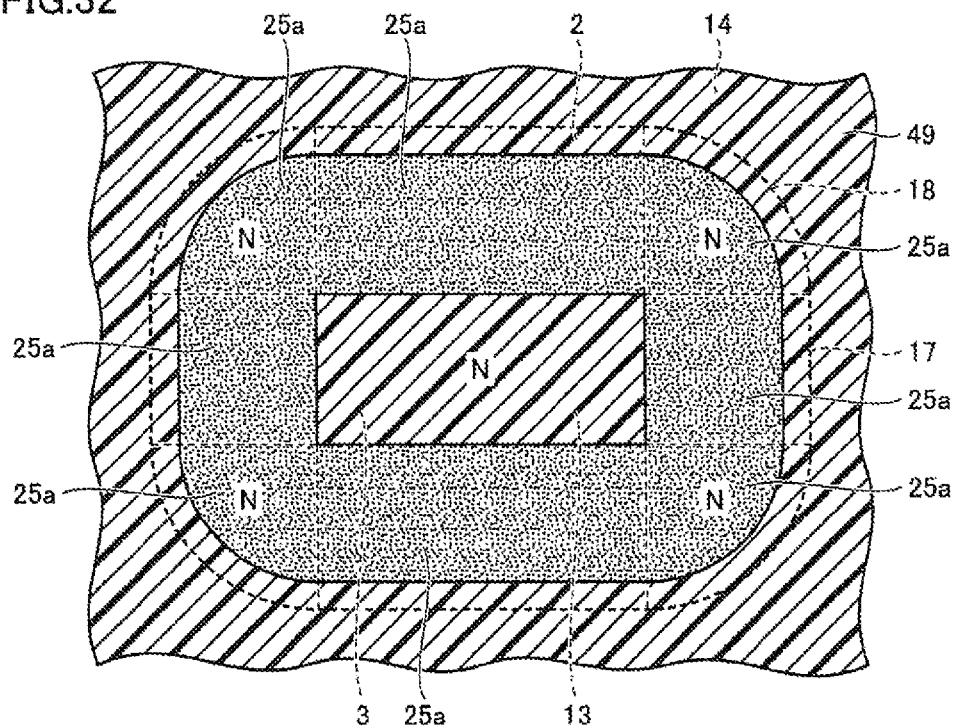
FIG. 32 is a plan view showing one step of distributing impurities into the high breakdown voltage isolation region, according to the fifth embodiment.

As shown in FIGS. 31 and 32, a resist pattern 49 is formed to expose corner portion 18 and linear portion 17, and cover other regions. Next, with resist pattern 49 as an implantation mask, an N type impurity 25a is implanted into corner portion 18 and linear portion 17 under a condition such that an optimized impurity concentration is obtained for N type diffusion layer 3b of corner portion 18. Resist pattern 49 is then removed.

Figure 33:
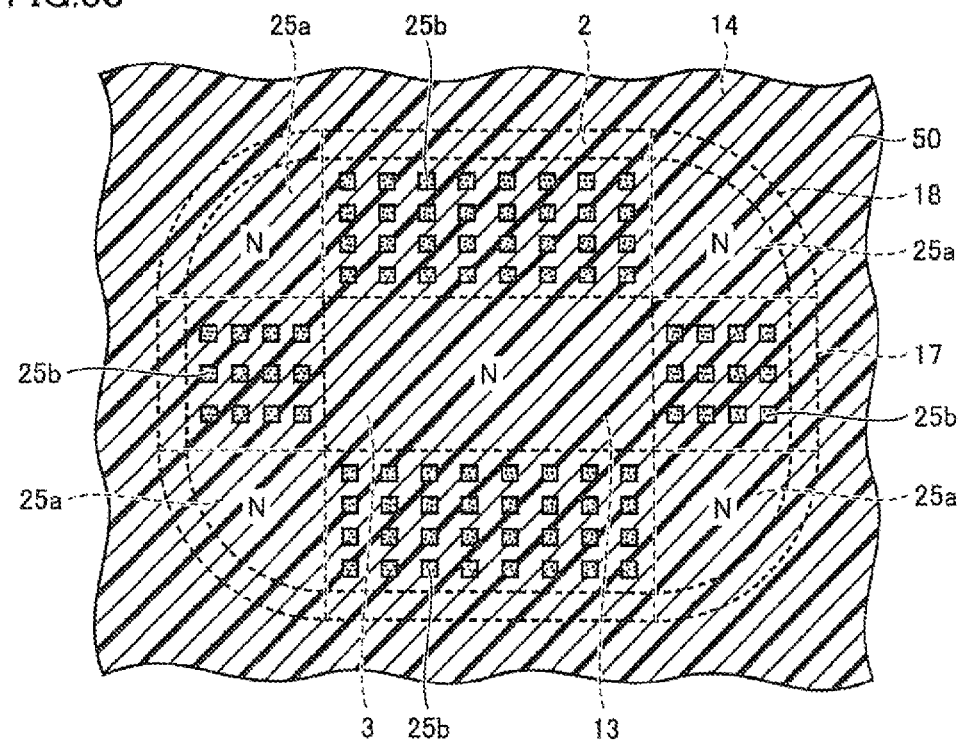
FIG. 33 is a plan view showing a step performed after the step shown in FIG. 32, according to the fifth embodiment.

Next, as shown in FIGS. 31 and 33, a resist pattern 50 is formed to cover corner portion 18, and cover linear portion 17 in the form of dots. Next, with resist pattern 50 as an implantation mask, a P type impurity 25b is implanted into linear portion 17 in the form of dots (or in the form of matrices). The amount of implantation of the P type impurity at this time is set to a prescribed amount of implantation such that the net concentration of the N type impurity after the N type impurity is neutralized becomes an optimized impurity concentration for N type diffusion layer 3a of linear portion 17.

Figure 34:
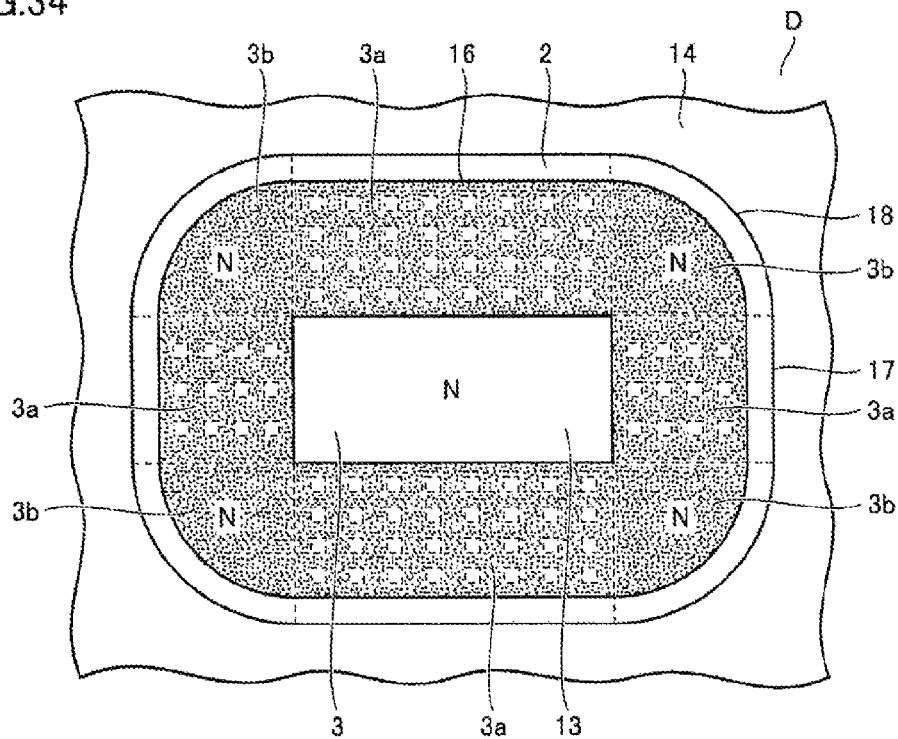
FIG. 34 is a plan view showing a step performed after the step shown in FIG. 33, according to the fifth embodiment.

Next, resist pattern 80 is removed to thereby form high breakdown voltage isolation region 16 electrically isolating high-side circuit region 13 and low-side circuit region 14, as shown in FIG. 34. Particularly in linear portion 17 of high breakdown voltage isolation region 16, a section in which the concentration of the N type impurity is relatively low is disposed in the form of dots (or in the form of matrices).

In semiconductor device D thus manufactured, the amount of N type impurity implanted into corner portion 18 and the amount of N type impurity implanted into linear portion 17 will ultimately be the same as in semiconductor device D described in the first embodiment. Consequently, the width of the depletion layer that extends in corner portion 18 and the width of the depletion layer that extends in linear portion 17 are substantially the same, so that a decrease in breakdown voltage in corner portion 18 can be prevented.

Particularly with the method for manufacturing semiconductor device D described above, since the P type impurity is implanted into linear portion 17 in the form of dots, the concentration of the N type impurity in linear portion 17 can be adjusted to be lower than the case where the P type impurity is implanted in the form of stripes, based on the same amount of implantation of the P type impurity.

Sixth Embodiment

A sixth example of introducing (implanting) impurities into the high breakdown voltage isolation region in a distributed manner, in the principle steps of the method for manufacturing a semiconductor device, will now be described.

Figure 35:
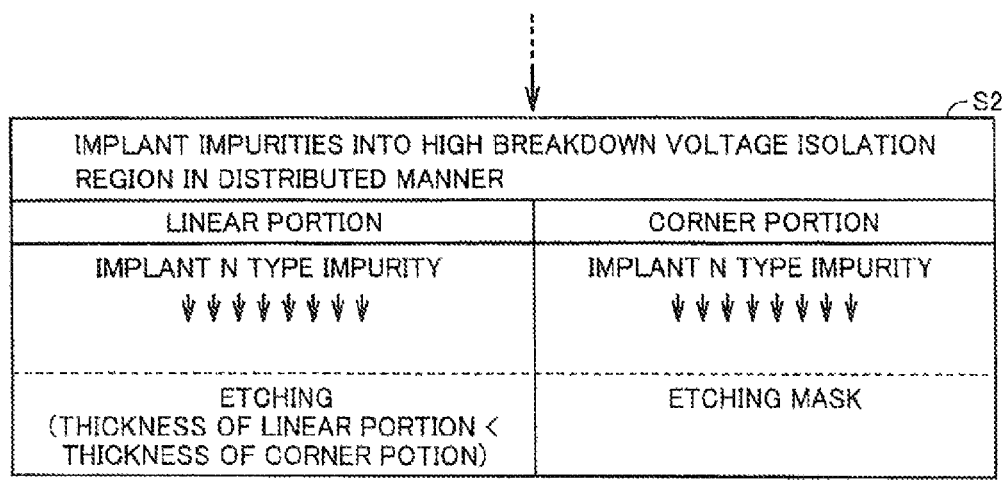
FIG. 35 is a diagram showing flows of distributing impurities into the high breakdown voltage isolation region in a method for manufacturing a semiconductor device with a high breakdown voltage element, according to a sixth embodiment of the present invention.
Figure 36:
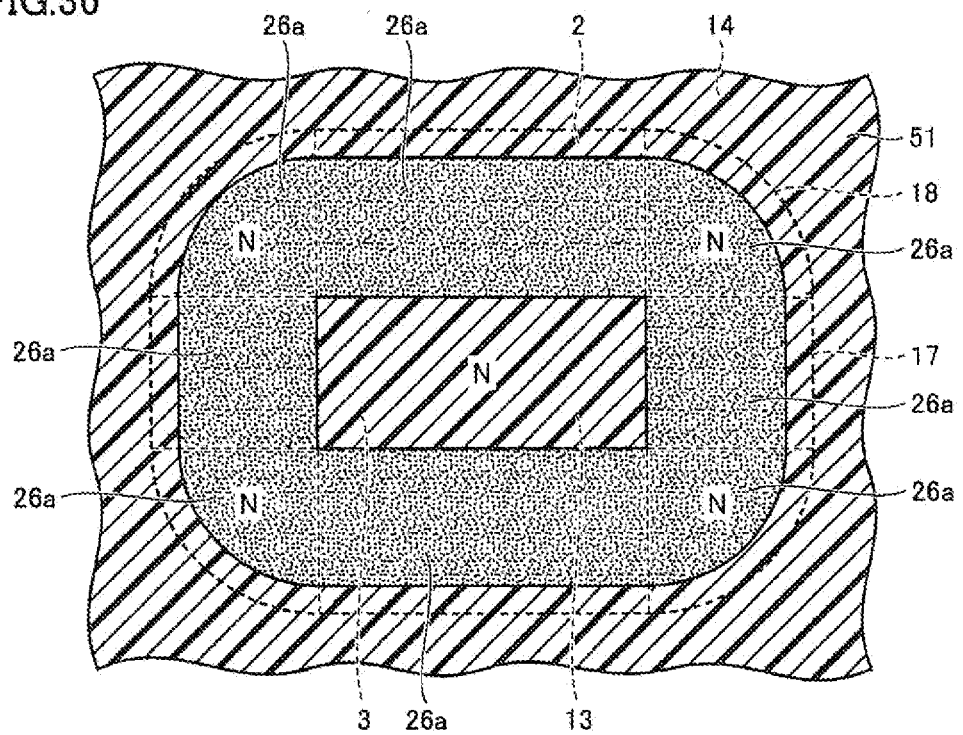
FIG. 36 is a plan view showing one step of distributing impurities into the high breakdown voltage isolation region, according to the sixth embodiment.
Figure 37:
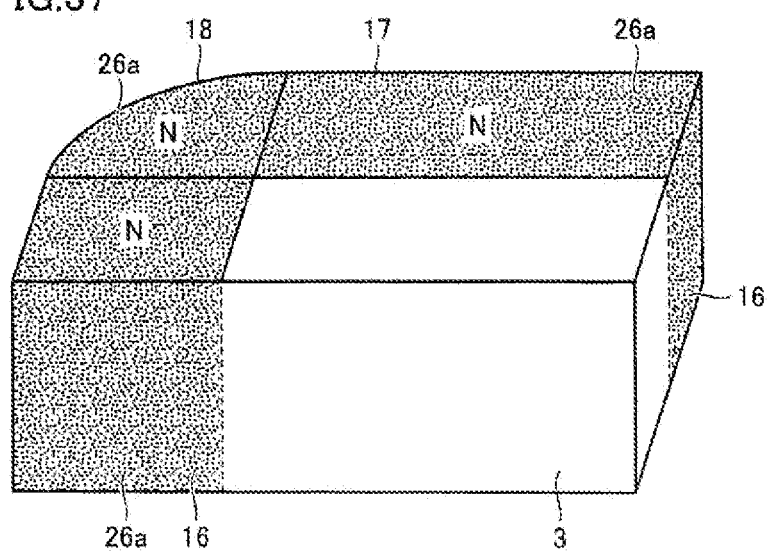
FIG. 37 is a partial cross-sectional perspective view showing a step performed after the step shown in FIG. 36, according to the sixth embodiment.

As shown in FIGS. 35 and 36, a resist pattern 51 is formed to expose corner portion 18 and linear portion 17, and cover other regions. Next, with resist pattern 51 as an implantation mask, an N type impurity 26a is implanted into corner portion 18 and linear portion 17 under a condition such that an optimized impurity concentration is obtained for N type diffusion layer 3b of corner portion 18. Resist pattern 51 is then removed, as shown in FIG. 37.

Figure 38:
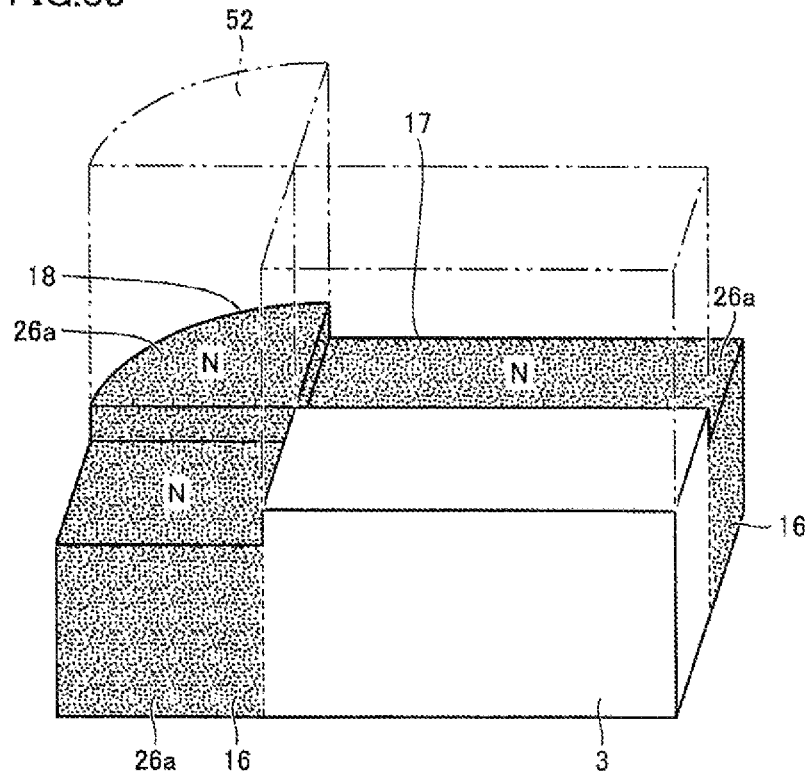
FIG. 38 is a partial cross-sectional perspective view showing a step performed after the step shown in FIG. 37, according to the sixth embodiment.

Next, as shown in FIGS. 35 and 38, a resist pattern 52 is formed to expose linear portion 17, and cover other regions. Next, with resist pattern 52 as an etching mask, the exposed linear portion 17 is subjected to etching, thereby lowering a position of an upper surface of linear portion 17 relative to a position of an upper surface of corner portion 18. That is, the thickness of linear portion 17 is made smaller than the thickness of corner portion 18.

With respect to the amount of etching (thickness) at this time, linear portion 17 is etched to a thickness at which the net concentration of the N type impurity becomes an optimized impurity concentration (number of impurity atoms) for N type diffusion layer 3a of linear portion 17.

Figure 39:
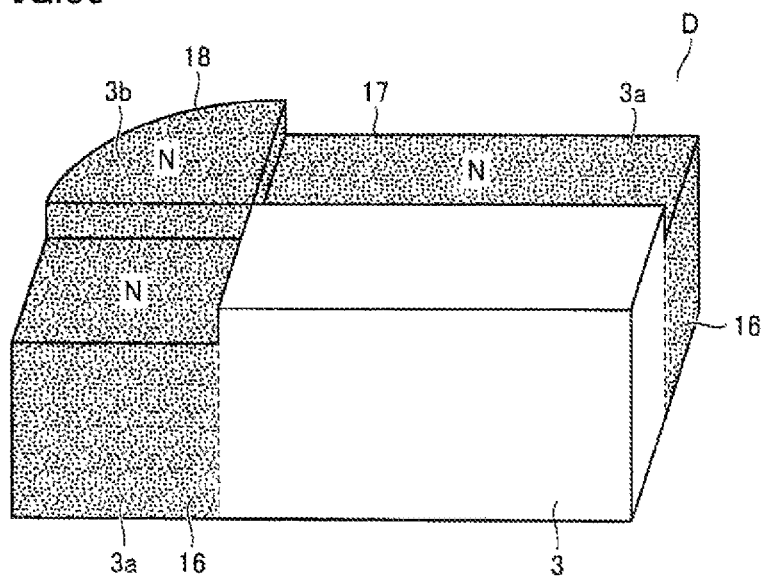
FIG. 39 is a partial cross-sectional perspective view showing a step performed after the step shown in FIG. 38, according to the sixth embodiment.

Next, resist pattern 52 is removed to thereby form high breakdown voltage isolation region 16 electrically isolating the high-side circuit region and the low-side circuit region, as shown in FIG. 39. Particularly in linear portion 17 of high breakdown voltage isolation region 16, the thickness of N type diffusion layer 3a is smaller than the thickness of N type diffusion layer 3b of corner portion 18.

In semiconductor device D thus manufactured, although the concentration of the N type impurity in N type diffusion layer 3a of linear portion 17 is the same as the concentration of the N type impurity in N type diffusion layer 3b of corner portion 18, the thickness of N type diffusion layer 3a of linear portion 17 is smaller than the thickness of N type diffusion layer 3b of corner portion 18. In this way, the amount of the N type impurity implanted into corner portion 18 and the amount of the N type impurity implanted into linear portion 17 become the same as in semiconductor device D described in the first embodiment. Consequently, the width of the depletion layer that extends in corner portion 18 and the width of the depletion layer that extends in linear portion 17 are substantially the same, so that a decrease in breakdown voltage in corner portion 18 can be prevented.

It is noted that in each of the above-described embodiments, high breakdown voltage isolation region 16 electrically isolating rectangular high-side circuit region 13 and low-side circuit region 14 has been described by way of example. Thus, as corner portion 18 in high breakdown voltage isolation region 16, a corner portion having a fan shape with a central angle of substantially 90 degrees has been described by way of example.

Figure 40:
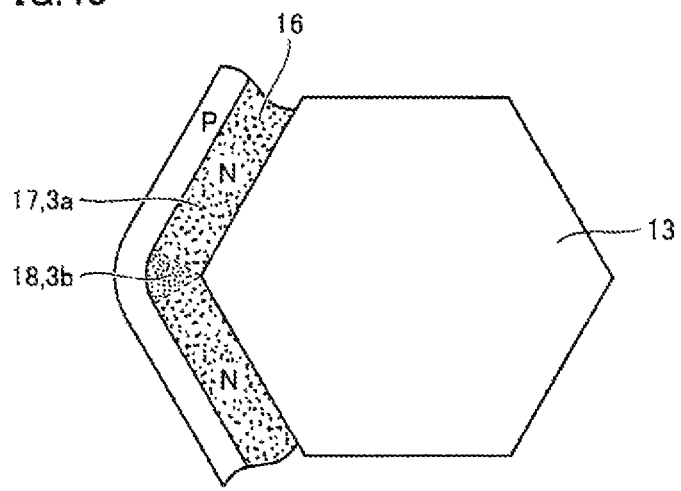
FIG. 40 is a partial plan view showing a first modification according to each embodiment.
Figure 41:
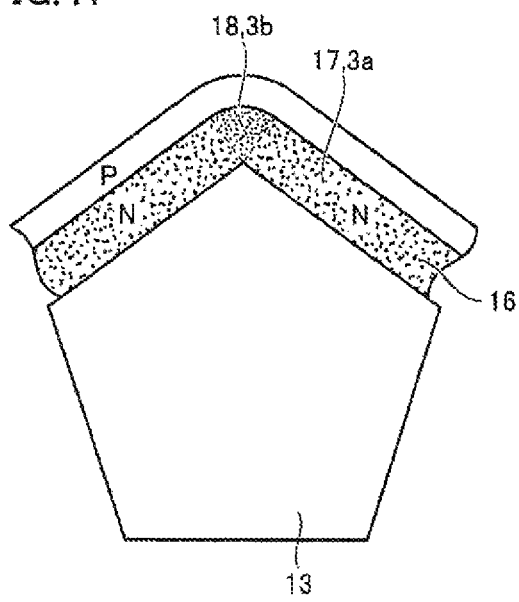
FIG. 41 is a partial plan view showing a second modification according to each embodiment.

The layout pattern of high-side circuit region 13 surrounded by high breakdown voltage isolation region 16 is not limited to a rectangular layout pattern, and high-side circuit region 13 may also be hexagonal as shown in FIG. 40, or pentagonal as shown in FIG. 41, for example. At each corner of these high breakdown voltage isolation regions 16, fan-shaped corner portion 18 is provided having a central angle corresponding to the corner and a radius corresponding to the width.

Furthermore, the layout pattern of high-side circuit region 13 is not limited to a polygonal pattern such as hexagonal or pentagonal. For a layout pattern including a linear pattern and a corner pattern, a linear portion may be formed along the linear pattern, and a corner portion may be formed along the corner pattern, and the impurity concentration may be set such that the number of impurity atoms in the corner portion and the number of impurity atoms in prescribed region UV in the linear portion (see FIG. 13) become the same. The corner pattern may also be a rounded pattern.

Figure 42:
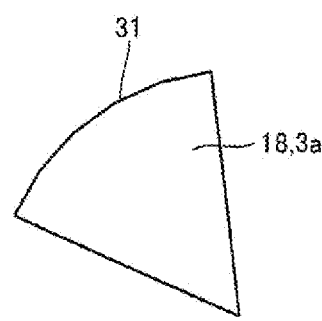
FIG. 42 is a partial plan view showing a third modification according to each embodiment.

Furthermore, as the corner portion, a corner portion having, on the layout, the arch-like junction surface (a portion of a columnar side surface) of N type diffusion layer 3b and P type diffusion layer 2 of corner portion 18 has been described by way of example; however, the corner portion may also have a junction surface (PN junction surface 31) that draws a broken line on the layout, as shown in FIG. 42.

The present invention can be effectively utilized as a semiconductor device with a lateral high breakdown voltage element.

While the embodiments of the present invention have been described above, it should be understood that the embodiments disclosed herein are illustrative and non-restrictive in every respect. The scope of the present invention is defined by the terms of the claims, and is intended to include any modifications within the scope and meaning equivalent to the terms of the claims.

What is claimed is:

1. A semiconductor device comprising:
a semiconductor substrate having a main surface;
a first semiconductor layer of a first conductivity type formed to cover said main surface of said semiconductor substrate;
a second semiconductor layer of a second conductivity type formed to reach a first depth from a surface of said first semiconductor layer;
a first region disposed in said first semiconductor layer, a first circuit driven with a first voltage being formed in said first region;
a second region disposed in said second semiconductor layer, a second circuit driven with a second voltage higher than said first voltage being formed in said second region; and
an isolation region of the second conductivity type formed with a width in said second semiconductor layer along said second region to surround said second region, said isolation region electrically isolating said first region and said second region,
said second region including a linear pattern and a corner pattern as a layout pattern,
said isolation region including:
a third semiconductor layer having a first impurity of the second conductivity type, said third semiconductor layer being located, with said width and a first thickness, along said linear pattern, and joins to said first semiconductor layer; and
a fourth semiconductor layer having a second impurity of the second conductivity type, said fourth semiconductor layer being located, with said width and a second thickness, along said corner pattern, and joins to said first semiconductor layer,
when an area of a junction surface where said fourth semiconductor layer and said first semiconductor layer join to each other is referred to as an area A, and a region having said width and said first thickness in said third semiconductor layer, in which an area of a junction surface where said third semiconductor layer and said first semiconductor layer join to each other corresponds to the same area as said area A, is referred to as a region A,
a concentration of said first impurity and said first thickness of said third semiconductor layer, and a concentration of said second impurity and said second thickness of said fourth semiconductor layer are set in such a manner that the number of atoms of said second impurity in said fourth semiconductor layer, and the number of atoms of said first impurity in said region A of said third semiconductor layer become the same.

2. The semiconductor device according to claim 1, wherein when each of said first voltage and said second voltage is applied,
a concentration of an impurity of the second conductivity type at which an electric field at said junction surface of said fourth semiconductor layer and said first semiconductor layer located at a bottom of said fourth semiconductor layer involves a critical voltage, is referred to as a concentration A, and
a concentration of an impurity of the second conductivity type at which an electric field at said junction surface of said third semiconductor layer and said first semiconductor layer located at a bottom of said third semiconductor layer involves the critical voltage, is referred to as a concentration B; then,
the concentration of said first impurity in said third semiconductor layer corresponds to said concentration B,
the concentration of said second impurity in said fourth semiconductor layer corresponds to said concentration A, and
said first thickness of said third semiconductor layer and said second thickness of said fourth semiconductor layer are set to be the same.

3. The semiconductor device according to claim 2, wherein said third semiconductor layer includes a first section in which the concentration of said impurity of the second conductivity type is relatively high, and a second section in which the concentration of said impurity of the second conductivity type is relatively low, and
said first section and said second section are disposed in the form of stripes.

4. The semiconductor device according to claim 2, wherein said third semiconductor layer includes a first section in which the concentration of said impurity of the second conductivity type is relatively high, and a second section in which the concentration of said impurity of the second conductivity type is relatively low, and
said second section is disposed in the form of dots.

5. The semiconductor device according to claim 1, wherein when each of said first voltage and said second voltage is applied,
a concentration of said impurity of the second conductivity type at which an electric field at said junction surface of said fourth semiconductor layer and said first semiconductor layer located at a bottom of said fourth semiconductor layer involves a critical voltage, is referred to as a concentration A, and
a concentration of said impurity of the second conductivity type at which an electric field at said junction surface of said third semiconductor layer and said first semiconductor layer located at a bottom of said third semiconductor layer involves the critical voltage, is referred to as a concentration B; then,
the concentration of said first impurity in said third semiconductor layer and the concentration of said second impurity in said fourth semiconductor layer correspond to said concentration A, and
said first thickness of said third semiconductor layer and said second thickness of said fourth semiconductor layer are set to be the same.

6. A method for manufacturing a semiconductor device comprising the steps of:
preparing a semiconductor substrate having a main surface;
forming a first semiconductor layer of a first conductivity type in which a first region is disposed to cover said main surface of said semiconductor substrate;

forming a second semiconductor layer of a second conductivity type in which a second region is disposed to reach a first depth from a surface of said first semiconductor layer;

forming, in said second semiconductor layer, an isolation region with a width to reach said first depth along said second region to surround said second region;

forming, in said first region, a first circuit driven with a first voltage; and forming, in said second region, a second circuit driven with a second voltage higher than said first voltage, in said second region, a layout pattern including a linear pattern and a corner pattern being formed as a layout pattern, and the step of forming said isolation region including the steps of:

forming said third semiconductor layer that has said width and reaches said first depth, by introducing a first impurity of the second conductivity type along said linear pattern, and forming said fourth semiconductor layer that has said width and reaches said first depth, by introducing a second impurity of the second conductivity type along said corner pattern, when an area of a junction surface where said fourth semiconductor layer and said first semiconductor layer join to each other is referred to as an area A, and a region that has said width and reaches said first depth in said third semiconductor layer, in which the area of a junction surface where said third semiconductor layer and said first semiconductor layer join to each other corresponds to the same area as said area A, is referred to as a region A, in the step of forming said third semiconductor layer and said fourth semiconductor layer, said first impurity to be introduced into a region where said third semiconductor layer is to be formed, and said second impurity to be introduced into said fourth semiconductor layer being adjusted in such a manner that the number of atoms of said second impurity to be introduced into said fourth semiconductor layer, and the number of atoms of said first impurity atoms to be introduced into said region A become the same.

7. The method for manufacturing a semiconductor device according to claim 6, wherein when each of said first voltage and said second voltage is applied, a condition for introducing a prescribed amount of said impurity of the second conductivity type at which an electric field at said junction surface of said fourth semiconductor layer and said first semiconductor layer located at a bottom of said fourth semiconductor layer involves a critical voltage, is referred to as a condition A, and a condition for introducing a prescribed amount of said impurity of the second conductivity type at which an electric field at said junction surface of said third semiconductor layer and said first semiconductor layer located at a bottom of said third semiconductor layer involves the critical voltage, is referred to as a condition B; then, the step of forming said third semiconductor layer and said fourth semiconductor layer includes:

a first step of introducing said first impurity under said condition B, into said region where said third semiconductor layer is to be formed, while covering with a mask a region where said fourth semiconductor layer is to be formed; and a second step of introducing said second impurity under said condition A, into said region where said fourth semiconductor layer is to be formed, while covering with a mask said region where said third semiconductor layer is to be formed.

8. The method for manufacturing a semiconductor device according to claim 6, wherein when each of said first voltage and said second voltage is applied, a condition for introducing a prescribed amount of said impurity of the second conductivity type at which an electric field at said junction surface of said fourth semiconductor layer and said first semiconductor layer located at a bottom of said fourth semiconductor layer involves a critical voltage, is referred to as a condition A, and a condition for introducing a prescribed amount of said impurity of the second conductivity type at which an electric field at said junction surface of said third semiconductor layer and said first semiconductor layer located at a bottom of said third semiconductor layer involves the critical voltage, is referred to as a condition B; then, the step of forming said third semiconductor layer and said fourth semiconductor layer includes:

a first step of introducing said second impurity under said condition A, into a region where said fourth semiconductor layer is to be formed, while introducing said first impurity into a region where said third semiconductor layer is to be formed; and a second step of introducing a third impurity of the first conductivity type in an amount smaller than in said condition A, into said region where said third semiconductor layer is to be formed, while covering with a mask said region where said fourth semiconductor layer is to be formed.

9. The method for manufacturing a semiconductor device according to claim 8, wherein in said second step, said impurity of the first conductivity type is introduced in the form of stripes.

10. The method for manufacturing a semiconductor device according to claim 8, wherein in said second step, said impurity of the first conductivity type is introduced in the form of dots.

11. The method for manufacturing a semiconductor device according to claim 6, wherein when each of said first voltage and said second voltage is applied, a condition for introducing a prescribed amount of said impurity of the second conductivity type at which an electric field at said junction surface of said fourth semiconductor layer and said first semiconductor layer located at a bottom of said fourth semiconductor layer involves a critical voltage, is referred to as a condition A, and a condition for introducing a prescribed amount of said impurity of the second conductivity type at which an electric field at said junction surface of said third semiconductor layer and said first semiconductor layer located at a bottom of said third semiconductor layer involves the critical voltage, is referred to as a condition B; then, the step of forming said third semiconductor layer and said fourth semiconductor layer includes:
a first step of introducing said second impurity under said condition B, into a region where said fourth semiconductor layer is to be formed, while introducing said first impurity into a region where said third semiconductor layer is to be formed; and
a second step of additionally introducing said second impurity into said region where said fourth semiconductor layer is to be formed, while covering with a mask said region where said third semiconductor layer is to be formed.

12. The method for manufacturing a semiconductor device according to claim 6, wherein
when each of said first voltage and said second voltage is applied,
a condition for introducing a prescribed amount of said impurity of the second conductivity type at which an electric field at said junction surface of said fourth semiconductor layer and said first semiconductor layer located at a bottom of said fourth semiconductor layer involves a critical voltage, is referred to as a condition A, and
a condition for introducing a prescribed amount of said impurity of the second conductivity type at which an electric field at said junction surface of said third semiconductor layer and said first semiconductor layer located at a bottom of said third semiconductor layer involves the critical voltage, is referred to as a condition B; then,
the step of forming said third semiconductor layer and said fourth semiconductor layer includes:
a first step of introducing said second impurity under said condition A, into a region where said fourth semiconductor layer is to be formed, while introducing said first impurity into a region where said third semiconductor layer is to be formed; and
a second step of subjecting said region where said third semiconductor layer is to be formed to etching, while covering with a mask said region where said fourth semiconductor layer is to be formed, thereby lowering a position of an upper surface of said third semiconductor layer relative to a position of an upper surface of said fourth semiconductor layer.

\* \* \* \* \*